United States Patent
Otsuki et al.

[19]

[11] Patent Number: 6,133,623
[45] Date of Patent: Oct. 17, 2000

[54] RESIN SEALING TYPE SEMICONDUCTOR DEVICE THAT INCLUDES A PLURALITY OF LEADS AND METHOD OF MAKING THE SAME

[75] Inventors: Tetsuya Otsuki; Kenzo Yoshimori, both of Suwa, Japan

[73] Assignee: Seiko Epson Corporation, Tokyo, Japan

[21] Appl. No.: 09/011,738

[22] PCT Filed: Jun. 27, 1997

[86] PCT No.: PCT/JP97/02234

§ 371 Date: Feb. 25, 1998

§ 102(e) Date: Feb. 25, 1998

[87] PCT Pub. No.: WO98/01907

PCT Pub. Date: Jan. 15, 1998

[30] Foreign Application Priority Data

Jul. 3, 1996 [JP] Japan ................................ 8-192780

[51] Int. Cl.[7] ........................... H01L 21/60; H01L 23/50; H01L 23/36
[52] U.S. Cl. .......................... 257/666; 257/691; 257/698; 257/784; 257/712; 257/675; 257/676; 438/123; 438/124
[58] Field of Search .................................. 257/666, 676, 257/672, 671, 692, 693, 784, 696, 698, 712, 713, 675, 717, 720, 690; 438/123, 124

[56] References Cited

U.S. PATENT DOCUMENTS

| 5,235,207 | 8/1993 | Ohi et al. ................................ 257/670 |
| 5,517,056 | 5/1996 | Bigler et al. ............................ 257/666 |
| 5,633,529 | 5/1997 | Otsuki .................................... 257/666 |
| 5,723,899 | 3/1998 | Shin ....................................... 257/666 |

FOREIGN PATENT DOCUMENTS

| 0 693 779 A2 | 1/1996 | European Pat. Off. . |
| 693-779 | 1/1996 | European Pat. Off. . |
| 1-93156 | 4/1989 | Japan . |
| 4-174 551 | 6/1992 | Japan . |
| 5-21694 | 1/1993 | Japan . |
| 6-53390 | 2/1994 | Japan . |
| 6-66351 | 3/1994 | Japan . |
| 8-83876 | 3/1996 | Japan . |

OTHER PUBLICATIONS

Karnezos et al., "EDQUAD—An Enhanced Performance Plastic Package", ASAT, Inc., (1994).

M. Karmezos et al., *EDQUAD—An Enhanced Performance Plastic Package*, IEEE, pp. 63–66, 1994.

*Primary Examiner*—Alexander O. Williams
*Attorney, Agent, or Firm*—Oliff & Berridge, PLC

[57] ABSTRACT

A resin sealing type semiconductor device comprises an element mounting member (10) having an element mounting surface (12), a semiconductor element (20) bonded to the element mounting surface (12), a plurality of leads (30) provided and separated from the semiconductor element (20), a frame lead (36) disposed between these leads (30) and the semiconductor element (20), various wires (40) and a resin sealing portion which seals the element mounting member (10), the semiconductor element (20), parts of the leads (30) and the frame lead (36). The leads (30) include first inner leads (32a) disposed discontinuously with the frame lead (36) and second leads (32b) disposed integrally with the frame lead (36).

The resin sealing type semiconductor device has good heat radiation characteristics and high reliability. Wire bonding with a highly flexible wiring arrangement design is provided by using leads commonly.

26 Claims, 18 Drawing Sheets

RESIN SEALING TYPE SEMICONDUCTOR DEVICE THAT INCLUDES A PLURALITY OF LEADS AND METHOD OF MAKING THE SAME

TECHNICAL FIELD

The invention relates to a semiconductor device characterized by lead construction and a method of making the same.

BACKGROUND OF ART

Semiconductor devices such as Very Large Scale Integrated Circuits (VLSIs) with a high degree of integration require a large number of electrodes (pads) for signal input and output on the chip and also a large number of power supply electrodes. This therefore requires a similarly large number of leads for connecting the electrodes.

Furthermore, when power is supplied to a semiconductor chip at a number of different points, if the wires for these different connections are of different lengths, they will have different resistances. As a result, there will be different voltage drops across them, and it will be difficult to ensure that the same voltage is applied to different electrodes. Additionally, if all the wires connecting the power supply to different electrodes are the same length, it is necessary to make them all equal to the longest wire, and thus the overall wire length is increased, resulting in an overall increase in the voltage drop.

JP 4-174551 discloses a semiconductor device that is designed to solve the foregoing problem. This semiconductor device provides a common inner lead laminated on the semiconductor chip circuit formation surface with an insulating adhesive. A plurality of inner signal leads is provided around the semiconductor chip, electrically connected to the semiconductor chip. Further, the semiconductor chip is sealed by molding resin while supported by the common inner lead.

This semiconductor device has advantages in that since no tab is provided to mount the semiconductor chip thereupon, tab to bonding wire shorting can be prevented, by using the common inner lead for power supply, the sharing of lead pins can be simply implemented. In particular, the provision of the common inner lead not only reduces the number of leads, but also reduces the voltage drop by shortening the wires.

However, in such a semiconductor device, the lamination of the common inner lead on the semiconductor chip surface imposes restrictions on the arrangement of the pads on the semiconductor chip surface. Also there are other problems such as contamination of the chip by the insulating adhesive that bonds the common inner lead to the semiconductor chip and bonding deficiencies caused by softening of the adhesive.

Further, JP 6-66351 discloses a semiconductor device in which a common inner lead is provided around a semiconductor chip. The common inner lead is not provided on the surface of the semiconductor chip, thus there are no restrictions on the arrangement of the pads on the semiconductor chip surface. Bonding deficiencies also are avoided.

However, since the tab on which the semiconductor chip is mounted is provided integrally on one lead, and the common inner lead is provided around this tab, it is difficult to ensure adequate insulation between the tab and the common inner lead. The common inner lead is formed in such a manner that one portion is cut off to avoid contacting the lead on which the tab is formed, and thus, placing restrictions on the design. Furthermore, such restrictions place further restrictions on the position at which the bonding is performed.

In recent years, with the increase in power consumption of the VLSI and similar devices, the demand for a plastic package with low cost and good heat radiation has increased. To meet this demand, in terms of the materials used, it has been considered to increase the thermal conductivity of the lead frame and sealing resin, and in terms of the structure, it has been considered to improve the heat radiation characteristics by changing the design of the lead frame or by adding a heat sink or radiator. In particular, the improvement of the heat radiation characteristics by adding a heat radiator is the most orthodox measure for Large Scale Integrated Circuits (LSIs) in which the power consumption is no more than about 2 watts per chip.

In consideration of the heat radiation, the inventors of the invention have previously invented the invention disclosed in JP 6-53390. This invention provides a heat radiator with high thermal conductivity having such a structure that an element may be mounted thereon in place of a die pad. In this case, the inner leads are supported by an insulating material disposed on the heat radiator.

As a result, by adopting this construction a semiconductor device can be obtained with excellent heat radiation properties.

DISCLOSURE OF THE INVENTION

The object of the invention is to provide a resin sealing type semiconductor device and a fabrication method thereof, enabling highly flexible wire arrangement design by making leads common so as to reduce the number of leads and the voltage drop with shortened wires.

Another object of the invention is to provide a resin sealing type semiconductor device which has good heat radiation efficiency and a fabrication method thereof.

A resin sealing type semiconductor device of the present invention comprises:

- an element mounting member having an element mounting surface for mounting a semiconductor element;
- a semiconductor element bonded to the element mounting surface of the element mounting member;
- a frame lead disposed around a periphery of the semiconductor element and separated from the semiconductor element and the element mounting surface, the frame lead being continuous around the periphery of the semiconductor element;
- a plurality of leads disposed on and insulated from the element mounting member, the leads being separated from the semiconductor element;
- a plurality of wires including at least wires electrically connecting the leads with the electrodes of the semiconductor element and wires electrically connecting the frame lead with the electrodes of the semiconductor element; and
- a resin sealing portion for sealing the element mounting member, the semiconductor element, parts of the leads and the frame lead, and wherein the plurality of leads comprises:
- first leads disposed discontinuously with the frame lead; and
- second leads disposed integrally with the frame lead.

With this semiconductor device can supply a stable voltage to the electrodes of the semiconductor element by a small number of leads by providing the frame lead between the semiconductor element and the leads and using the frame lead and the second lead continuous to the frame lead, for example, as power supply leads. This enables increased operating speed with reduced power supply noise.

Moreover, the leads corresponding to the leads which are made common by the frame lead are available for use for example as signal leads, and thus design flexibility is improved.

In the semiconductor device, the leads include first leads disposed discontinuously with the frame lead and second leads disposed integrally with the frame lead. Since the frame lead is supported by the second leads at a plurality of locations, the frame lead is held in place with sufficient mechanical strength at a given position. Even if the frame lead is somewhat deflected downwardly under its own weight, thus, the distance between the frame lead and the element mounting member can be sufficiently secured. Since the second leads are formed integrally with the frame lead, the number of wire bonding steps can be correspondingly reduced. This is advantageous in the manufacturing process. In addition, since the leads have their cross-sectional areas substantially larger than those of the wires with reduced electric resistance, the voltage drop can be correspondingly reduced.

With the semiconductor device, it is preferable that end portions of inner leads constituting the parts of the first leads extend to positions at which the ends of the inner leads overlap the element mounting surface of the element mounting member. With this construction, during wire bonding of the inner leads the element mounting surface may serve also as a support for the end portions of the inner leads.

In the semiconductor device, it is preferable that an insulating lead support is bonded to the element mounting member and the leads so that a portion of the insulating lead support is in-between the element mounting member and the leads, the insulating lead support allowing free ends of the inner lead of each of the first leads to contact the element mounting surface of the element mounting member within the limit of resilient deformation. With this construction, during the wire bonding step the free ends of the inner leads are deformed downward, and contact the element mounting surface with the lead support portion as fulcrum, enabling reliable and stable wire connections, and the inner leads are to be supported reliably by the lead support portion.

It is also preferable to improve the heat radiation efficiency by forming the element mounting member with a substance having high thermal conductivity.

It is further preferable that the element mounting member comprises a substance which not only has high thermal conductivity but also has high electrical conductivity such as copper, aluminum, silver or gold, or a metal alloy containing one or more of these metals as principal constituents, whereby the element mounting member can be used as a grounding component.

For example, if the element mounting member is at a negative potential, the frame lead is at a positive potential and the frame lead is disposed above the element mounting member, then when the lead frame is resin sealed, it is added as though a capacitor were connected between the element mounting member and the lead frame reducing the noise.

Further, with the semiconductor device, it is preferable that at least one of a first conducting layer and a second conducting layer is formed on the element mounting surface, the first conducting layer providing a ground for the electrodes of the semiconductor element and the second conducting layer providing a ground for the first leads. With this construction, grounding of the electrodes of the semiconductor element and grounding of the first leads can be carried out in any position. As a result, the number of grounding leads can be reduced which again improves the wiring arrangement design flexibility.

For example, these conducting layers for grounding are formed by plating the element mounting surface with silver, gold, palladium or aluminum.

The first and second conducting layers may be formed in a mutually separated or continuous manner.

With the semiconductor device, it is preferable that an insulating layer is formed on the surface of the element mounting member excluding the area on which the first and second conducting layers are formed. The insulating layer preferably comprises a metal oxide film obtained by oxidizing the metal constituting the element mounting member. By forming this insulating layer, short-circuiting of the leads and frame lead with the electrically conductive element mounting portion may be prevented. Furthermore, when the insulating layer comprises a metal oxide film, it is normally a dark color such as black, which makes it easy to distinguish the leads by means of an image recognition system when wire bonding is carried out. In comparison with the metal, this metal oxide film has better bonding properties with the resin used to form the resin sealing portion. Thus, the mechanical strength of the package is improved.

With the semiconductor device, the element mounting member may be of the type which is sealed within the resin sealing portion, or of the type which is partially exposed. For greater heat radiation efficiency, the exposed type is preferable.

For example, it is preferable that the element mounting member has a large portion including the element mounting surface, and a small portion projecting from this large portion forming an inverted T-shape cross-section. Moreover, it is preferable that the end surface of the small portion is exposed from the resin sealing portion. With this construction, since it is possible to increase the surface area of the element mounting member, heat generated from the semiconductor element can be dispersed efficiently through the element mounting member, and can be radiated to the outside from the surface exposed by the resin sealing portion, thus providing good heat radiation efficiency. Since it is possible to increase the distance between the element mounting surface on which the semiconductor element is mounted and the surface exposed from the resin sealing portion, ingress of gas, moisture or other substances which would have an adverse effect on the semiconductor element or wiring can be restricted. To improve the junction between the element mounting member and the resin sealing portion, it is preferable that the small portion of the element mounting member has an undercut form in the thickness direction, or the large portion has resin penetration holes passing therethrough in the thickness direction.

With the semiconductor device, it is preferable that the frame lead has identifying projections or notches which provide a marking function for wire bonding image recognition. With the provision of these identifying projections or notches, bonding positions can be identified accurately and easily by means of image recognition during wire bonding.

It is further preferable that the frame lead has a substantially rectangular or square ring-shaped planar configuration and that the frame lead is supported by support bars at four corners in the ring. Thus, the frame lead can be reliably supported by the support bars.

It is desirable that the external diameter of the frame lead is preferably in the range of 15% to 80%, more preferably in the range of 20% to 70% relative to the external diameter of the resin sealing portion. The lower limit of the above range depends on the size of a semiconductor element placed on the element mounting member. In other words, the internal diameter of the frame lead is set at least to secure a sufficient space in which the frame lead is not in contact with the semiconductor element. Further, the upper limit of the above range is mainly set to secure an area in which the first leads discontinuous to the frame lead can be located. When the frame lead is larger than the upper limit, it tends to deform under its own weight. This results in an easy short-circuit between the frame lead and the element mounting surface.

In practice, the frame lead has its width ranging preferably between 0.1 mm and 2 mm and more preferably between 0.2 mm and 1 mm. The width of the frame lead is determined depending on various factors including the matters of design, mechanical strength, wire-bonding, etching with respect to the semiconductor element.

The present invention also provides a method of making a resin sealing type semiconductor device, preferably comprising the steps of:

(a) bonding a semiconductor element to a fixed position of on an element mounting surface of an element mounting member using an adhesive, preferably an electrically conductive adhesive;

(b) disposing an insulating lead support portion on the element mounting surface of the element mounting member, disposing a lead frame comprising integrally at least a frame lead, first leads discontinuous with the frame lead and second leads continuous with the frame lead, and bonding with adhesive the element mounting member and the lead frame with the lead support portion interposed therebetween;

(c) forming wires including wires electrically connecting the first leads and electrodes of the semiconductor element, and wires electrically connecting the frame lead and the electrodes of the semiconductor element, using a wire bonding means; and (d) disposing the components formed in the steps (a) to (c) in a metal mold, and forming a resin sealing portion by a molding process.

In step (c) above, it is preferable that wires connecting the leads and the electrodes of the semiconductor element are formed by depressing the leads with lead pressers so that the ends thereof are in contact with the element mounting surface of the element mounting member.

According the methods of the present invention, the semiconductor device can effectively be made.

BRIEF DESCRIPTION OF DRAWINGS

The invention will be described in detail with reference to the following drawings, wherein.

BEST MODE FOR CARRYING OUT THE INVENTION (First Embodiment)

Figure 1:
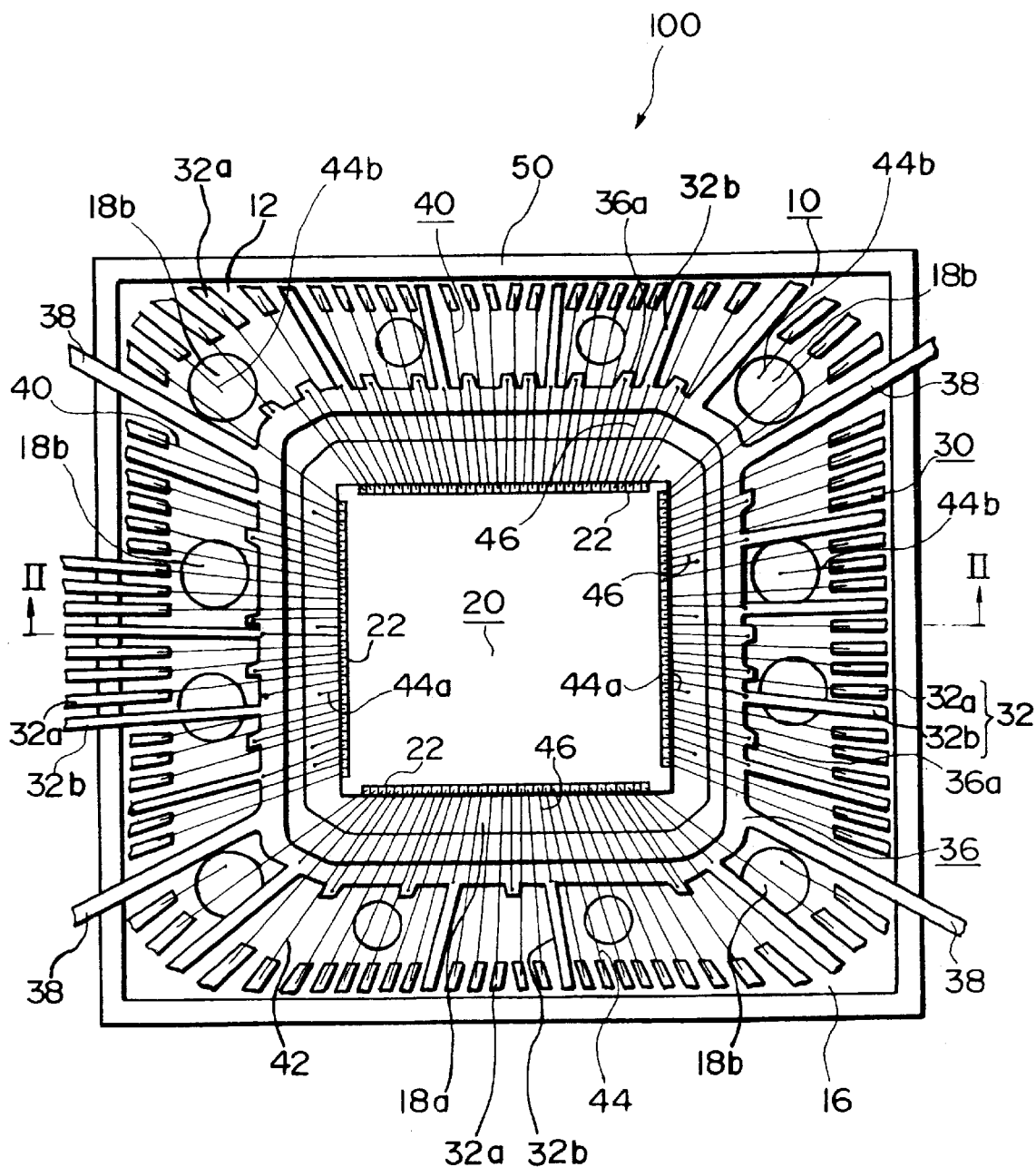
FIG. 1 is a plan view showing schematically essential portions of a first embodiment of the invention.
Figure 2:
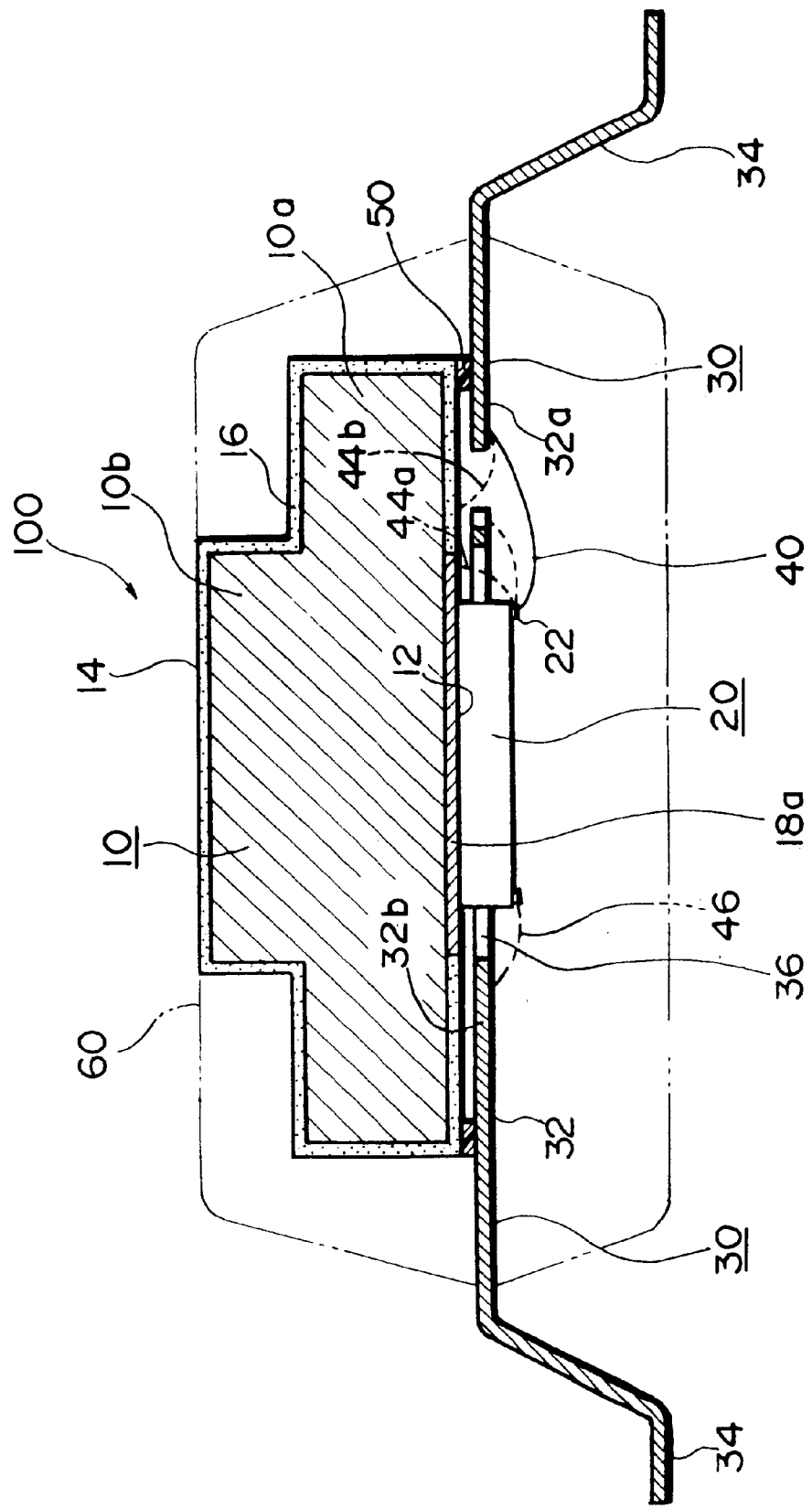
FIG. 2 is a schematically sectional view taken along the line II—II in FIG. 1.

FIG. 1 is a plan view showing schematically a semiconductor device of a first embodiment of the invention, without a resin sealing portion. FIG. 2 is a schematically sectional view taken along line II—II of FIG. 1.

A semiconductor device 100 of this embodiment comprises an element mounting portion 10, a semiconductor element 20 bonded to a element mounting surface 12 of the element mounting portion 10, a plurality of leads (group of leads) 30 and a frame lead 36 disposed on the periphery of the semiconductor element 20.

As shown in FIG. 2, the element mounting portion 10 comprises a large portion 10a and a small portion 10b protruding therefrom, and thus substantially forms an inverted T-shape in cross-section. The lower surface of the large portion 10a forms the element mounting surface 12, and the upper surface of the small portion 10b forms an exposed surface 14.

As shown in FIG. 1, on the element mounting surface 12 are formed a first conducting layer 18a including a region on which the semiconductor element 20 is disposed and the surface area of the first conducting layer 18a being larger than that of such a region, and a plurality of second conducting layers 18b in a spot-shape separated from the first conducting layer 18a. In addition to the conducting layers 18a and 18b, an insulating layer 16 is formed on the surface of the element mounting portion 10.

The element mounting portion 10 may be formed from epoxy substrate or a ceramic, but preferably comprises an electrically conducting material with good thermal conductivity such as copper, aluminum, silver or gold, or of an alloy having these metals as principal components. In particular, when economic considerations are taken into account, copper is a preferred metal.

There is no particular restriction on the material used to form the conducting layers 18*a* and 18*b*, but silver, gold, palladium and aluminum may be cited as examples. When conductivity and the bonding effect with the semiconductor element 20 are considered, silver is particularly preferable. The conducting layers 18*a* and 18*b* may be formed by methods such as plating or bonding, and are used as grounding surfaces as described in detail below.

Further, there is no particular restriction on the material for the insulating layer 16, as long as it has good insulating characteristics, but it is preferably a metal oxide film obtained for example by oxidizing the metal forming the element mounting portion 10. For example, when the element mounting portion 10 comprises copper, the insulating layer may be obtained by applying a strong alkaline reagent to oxidize the surface. With the element mounting member 10 formed of aluminum, it may be anodized to provide an oxide film (alumite: trade name) which is in turn used as an insulating layer. By providing the insulating layer 16, it is possible to prevent short-circuiting of the leads 30 and frame lead 36 with the element mounting portion 10. Furthermore, when the insulating layer 16 comprises for example copper oxide, it normally has a dark color such as black or brown and makes it easy to distinguish the leads 30 by means of an image recognition system during the wire bonding. Moreover, the insulating layer 16 has good bonding properties with a resin used to form a resin sealing portion 60, and thus improving the mechanical strength of the package.

The semiconductor element 20 is bonded to the first conducting layer 18*a* formed on the element mounting surface 12 of the element mounting portion 10, using for example silver paste. Then a plurality of electrode pads 22 is formed in a fixed arrangement on the surface of the semiconductor element 20.

The lead support portion 50 is fixed by bonding continuously around the periphery of the element mounting surface 12. This lead support portion 50 may be a strip-shaped material, and is formed of an insulating resin such as thermosetting resin including polyimide resin or epoxy resin.

The leads 30 comprise inner leads 32 which include first inner leads 32*a* disposed in discontinuity to the frame lead 36 and second inner leads 32*b* disposed in integral continuity to the frame lead 36.

Figure 3:
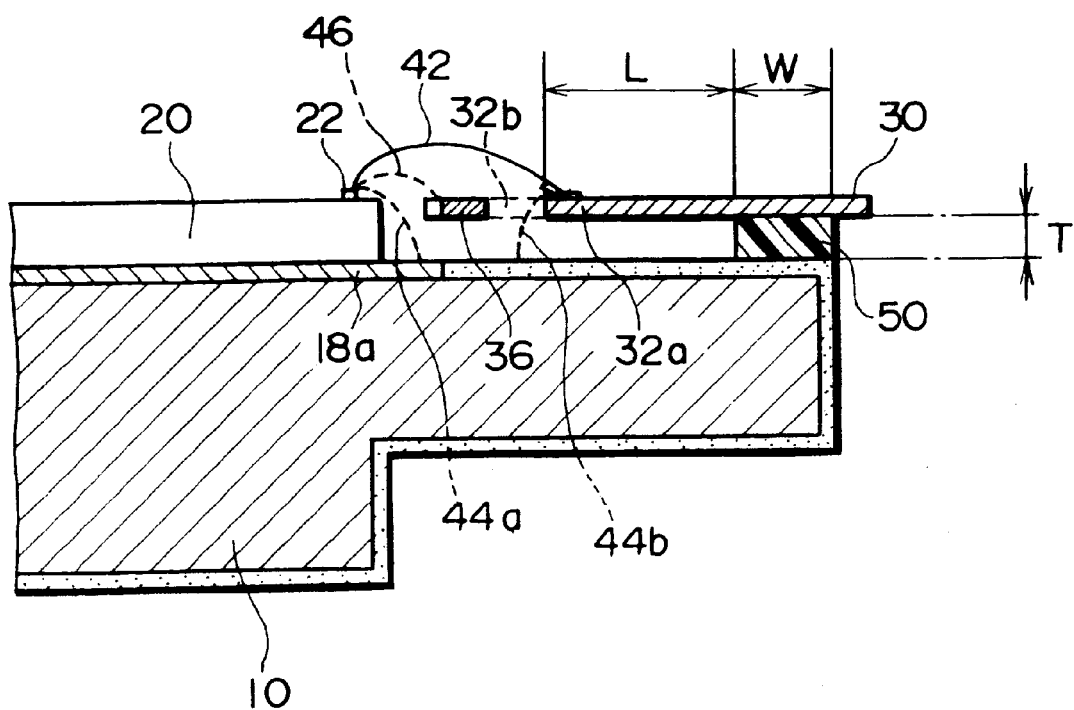
FIG. 3 is an enlarged sectional view showing the essential portions of FIG. 1.

The inner leads 32 (i.e., 32*a* and 32*b*) are, as shown enlarged in FIG. 3, fixedly bonded to the lead support portion 50 at positions separated by a predetermined distance L from the tips of the first inner leads 32*a*. As a result, the inner leads 32 are fixed to the element mounting portion 10 having the lead support portion 50 interposed therebetween.

In other words, the lead support portion 50 is provided with a relatively small width W around the outer periphery of the element mounting portion 10 in order to support the inner leads 32 by a portion only. The lead support portion 50 comprises a resin which is essentially water-absorbent as its characteristic, but because of being formed with a small width as described above, the amount of water absorbed can be reduced as much as possible. Further, the lead support portion 50 is provided to avoid the area of the wire bonding for the first inner leads 32*a*.

The first inner leads 32*a* are electrically connected to the electrode pads 22 of the semiconductor element 20 through wires 40 of gold, silver or the like (e.g., signal wires 42).

Figure 4:
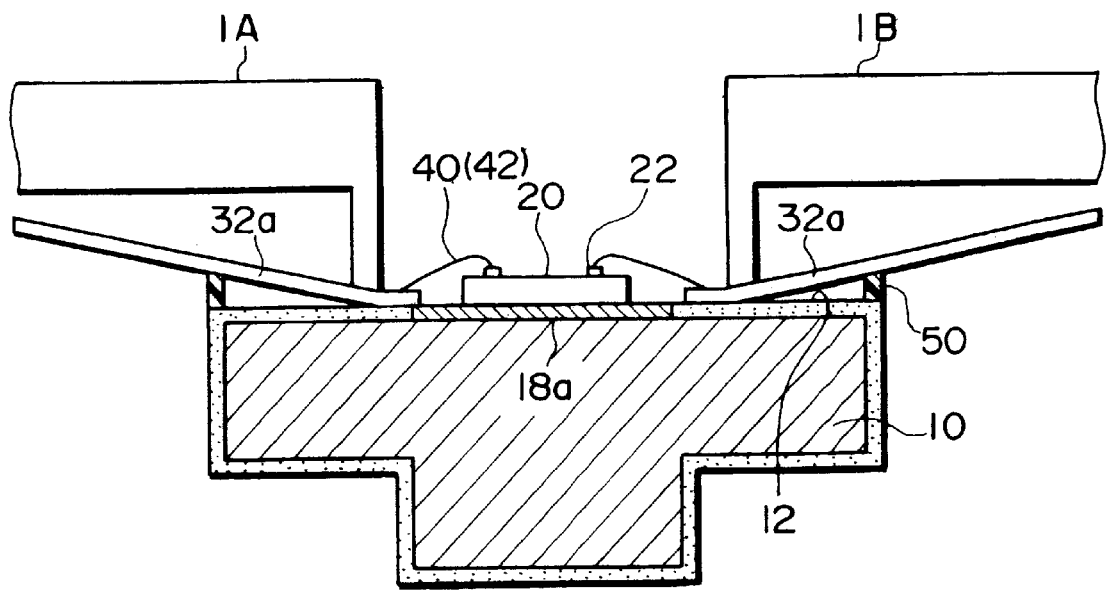
FIG. 4 is a diagram showing a wire bonding process of inner leads.
Figure 5:
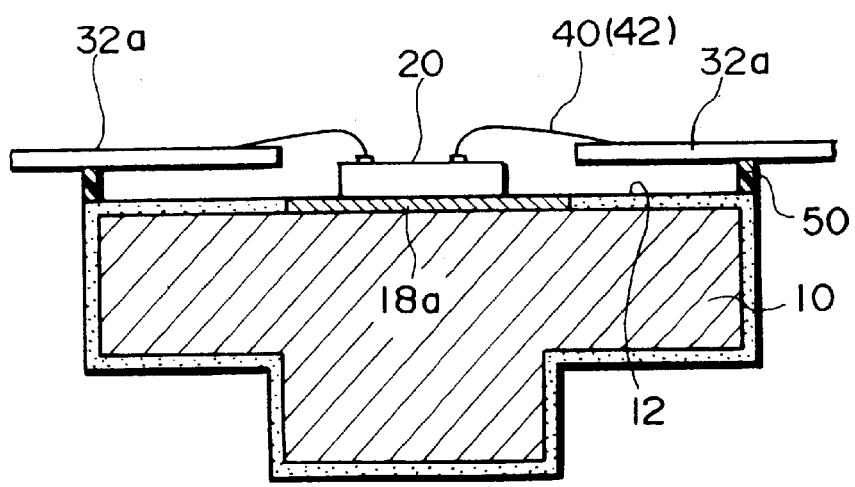
FIG. 5 is a diagram showing the state after completion of the wire bonding shown in FIG. 4.

The wire bonding between the first inner leads 32*a* and electrode pads 22 is illustrated in FIGS. 4 and 5. It should be noted that if the wire bonding is carried out sequentially with the shortest wires first, the jig which clamps the wire is prevented from snagging on a wire which has already been bonded, and breaking it.

First, as shown in FIG. 4, when lead pressers 1A and 1B press down the free ends of the first inner leads 32*a*, the free ends are deformed downward, with the lead support portion 50 as fulcrum, and the end portions thereof contact the element mounting surface 12. In this state, the wire bonding can be carried out to provide a positive and reliable connection in the wires 40 (or 42).

Thus, the lead support portion 50, being formed of resin, is easily softened by heat when carrying out the wire bonding, but since as described above the lead support portion 50 is provided to avoid the area of the wire bonding, it is not easily affected by heat. It is possible to avoid the problem of the lead support portion 50 acting as a cushion and making the wire bonding operation difficult.

After the wire bonding is completed, by removing the lead pressers 1A and 1B, as shown in FIG. 5, the first inner leads 32*a* are returned by their own resilience to being supported in the horizontal position. Moreover, the inner leads 32 and the element mounting portion 10 are electrically insulated by the insulating lead support portion 50.

When such a bonding process and the mechanical stability of the inner leads are considered, there are requirements such as for the free ends of the first inner leads 32*a* to have sufficient length to be brought in contact with the element mounting surface 12 within the limits of their resilient deformation, and also to have adequate mechanical strength to return completely to the original horizontal position after the bonding is completed. The length and mechanical strength of the free ends of the first inner leads 32*a* should be appropriate to meet these requirements. These requirements may take different forms depending on the device size, design features of the semiconductor element 20, the lead strength and other factors. There are also requirements for the insulating lead support portion 50 to have adequate thickness to be able to electrically insulate the inner leads 32 and the element mounting portion 10, to support the inner leads 32 stably, and to have limited deformation or deterioration during the heat processing.

In consideration of the above points, the following design rule may be given as a numerical example for the parameters shown in FIG. 3: a width W of the lead support portion 50, a thickness T of the lead support portion 50, a length L of the free ends of the first inner leads 32*a*, and the thickness t of the inner leads 32.

W: about 0.5 mm–2 mm
T: about 0.025 mm–0.125 mm
t: about 0.10 mm–0.30 mm
L: at least about 2.0 mm Next, the connection of the grounding wires is described with reference to FIGS. 1 and 3.

The conducting layers 18*a* and 18*b* on the element mounting portion 10 act as grounding surfaces. Specifically, the exposed surface of the first conducting layer 18*a* and a plurality of electrode pads 22 for grounding are connected by grounding wires 44*a*, whereby the exposed surface of the first conducting layer 18*a* can be made to be common for grounding purposes. Furthermore, by connecting the second conducting layer 18*b* and the first inner leads 32*a* with grounding wires 44b, the second conducting layer 18b can be used as a grounding surface for the leads. In this way, the conducting layers 18a and 18b function respectively as grounding surfaces either common or separate for the electrode pads 22 and first inner leads 32a. As a result, the number of leads made common for grounding are available for use for example as signal leads, and the wiring design flexibility is thus increased.

The grounding by the conducting layers 18a and 18b may take a variety of forms, and the following may be listed as examples.

a) When there is no ground on the semiconductor element 20 side, and one or more of the first inner leads 32a is grounded, the back surface potential of the semiconductor element 20 can be taken as ground potential.

b) When a plurality of the electrode pads 22 of the semiconductor element 20 are grounded, and at least one of the first inner leads 32a is grounded, then at least one of the leads provides grounding for a large number of grounding points of the semiconductor element 20, and thus a stable ground potential may be obtained.

c) When one of the electrode pads of the semiconductor element 20 and one of the first inner leads 32a are grounded, then the back surface of the semiconductor element 20, the grounding electrode pad of the semiconductor element 20, and the lead ground are made common, and can be set to the same potential. As a result, the semiconductor element potential can be stabilized, and the operation stabilized.

As for the wire bonding described above, the grounding wires should be connected sequentially with the shortest wires first.

The frame lead 36 is disposed between the semiconductor element 20 and the first inner leads 32a so as not to be in contact with either, and preferably located in a position offset from the conducting layers 18a and 18b in order to avoid shorting. The frame lead 36 is of substantially rectangular or square ring-shaped planar configuration and stably supported by support bars 38 at four corners. A portions of each of the support bars 38 are fixed by the lead support portion 50. In the present embodiment, the support bars 38 have no function as leads.

As shown in FIG. 1, the frame lead 36 has a plurality of identifying projections 36a formed thereon at predetermined positions. The identifying projections 36a facilitate identification of the bonding positions in the wire bonding process. In other words, the wire bonding is carried out by first storing reference coordinates for the electrode pads 22 on the semiconductor element 20 and reference coordinates for the bonding positions on the lead frame, and then using an image recognition system to detect the offsets of the actual coordinates of the electrode pads 22 to be bonded and the lead frame, computing corrected coordinates based on these, and then carrying out the operation automatically and continuously. In this, the identifying projections 36a function as markings for the detection of the bonding positions by the image recognition system. Alternatively, the identifying projections 36a may be replaced by notches (not shown) which are formed in the frame lead 36.

This frame lead 36 as well as the second inner leads 32b continuous to the frame lead 36 are used as a lead for a power supply voltage (Vcc) or a lead for a reference voltage (Vss). When the frame lead 36 is used for example as a Vcc lead, a plurality of power supply electrode pads 22 are connected to the frame lead 36 by respective power supply wires 46, and thereby the number of inner leads 32 used for power supply can be substantially reduced. As a result, it is possible to increase relatively the number of leads which can be used as signal leads, and flexibility for the wire connections between electrode pads of the semiconductor element and leads is increased, which is beneficial from the design point of view.

Moreover, the provision of the frame lead 36 enables a fixed power supply voltage or reference voltage to be supplied to any point on the surface of the semiconductor element 20, and thus operating speeds can be increased while reducing the power supply noise.

Since the frame lead 36 is positioned outside the semiconductor element 20, the spatial restrictions are few, and the frame lead 36 can be provided with adequate width. As a result, if the frame lead 36 is used as a power supply lead, its electrical resistance can be made low, and a stable voltage can be supplied to any point.

Moreover, when the frame lead 36 is used as a power supply lead, since the conducting layers 18a and 18b face the frame lead 36, the whole functions as a capacitor, not only reducing power supply noise, but also supporting high speed operation.

The semiconductor device of the present invention is further characterized in that it can have a sufficient support strength since the frame lead 36 is suspended by a plurality of second inner leads 32b in addition to support by the support bars 38. Even if the frame lead 36 is downwardly deflected under its own weight, the gap between the frame lead 36 and the element mounting member 10 can be maintained at a given value for example, equal to or more than 3.0 μm. Furthermore, each of the second inner leads 32b has a reduced electric resistance since its cross-sectional area is larger than that of the bonding wires. Thus, the second inner leads 32b can supply a steady voltage to the frame lead 36 with a reduced voltage drop. In addition, the second inner leads 32b does not require any wire-bonding step for connecting the inner leads and the frame lead since they are formed integral with the frame lead 36. This is advantageous in the manufacturing process.

As described, the number and layout of the second inner leads 32b are mainly determined depending on the matters of design in the semiconductor device as well as the support strength of the frame lead 36. From the viewpoint of supporting the frame lead 36, it is desirable that the second inner leads 32b are arranged symmetrically with respect to each side of the frame lead 36. However, the present invention is not limited to such a symmetrical arrangement, but may be applied to any of various forms depending on the size, shape and so on of the device as far as the gap between the frame lead 36 and the element mounting surface 12 is secured. In other words, the second inner leads 32b may be different in number and layout from those on the other sides of the frame lead 36. Alternatively, the frame lead 36 may have a side on which there is no second inner leads 32b.

Next, the fabrication method of the semiconductor device 100 in this embodiment is described.

Figure 6:
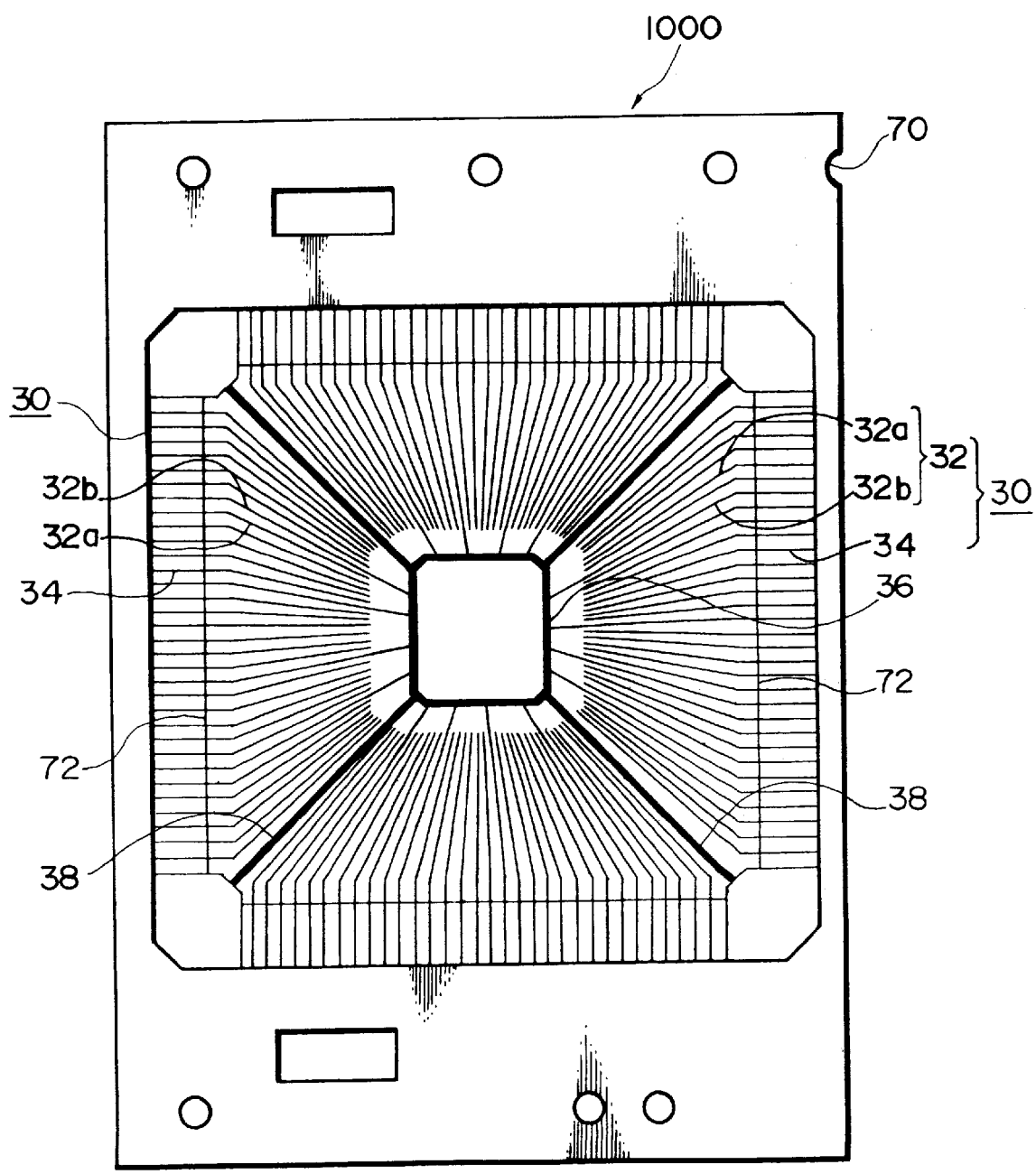
FIG. 6 is a plan view showing schematically a lead frame used in the fabrication of the semiconductor device of the first embodiment.

Firstly, referring to FIG. 6, a lead frame 1000 is described. The lead frame 1000 has inner leads 32 including first inner leads 32a and second inner leads 32b leads 30 including outer leads 34, frame lead 36 and support bars 38, integrally supported and formed on a substrate frame 70 in a given arrangement. The outer leads 34 are coupled together by a dam bar 72 providing reinforcement for the lead frame. The inner leads 32 extend from the outer leads 34 so as to leave vacant a central region, that is a device hole. The frame lead 36 is disposed within this region, the four corners of the frame lead 36 are supported by support bars 38, and each edge of the frame lead 36 is supported by the second inner leads 32b. Each of the support bars 38 is connected to the dam bar 72.

Meanwhile, on the element mounting portion 10, as shown in FIGS. 1 and 2, conducting layers 18a and 18b are formed by for example silver plating in certain regions of the main element mounting portion comprising the large portion 10a and small portion 10b. Then with masking applied to the conducting layers 18a and 18b, the main element mounting portion is immersed in for example "Ebonol" (trademark) made by Meltex Co. for several seconds, to oxidize the surface and form the insulating layer 16. The insulating layer formed in this way has a film thickness of for example about 2 tm to 3 tm and a electrical resistivity of at least about 1013 tcm, and thus its insulating properties have been confirmed to be good.

It is equally possible to reverse the above procedure, and form the conducting layers 18a and 18b after the formation of the insulating layer 16.

The semiconductor element 20 is bonded to a fixed position on the element mounting surface 12 of the element mounting portion 10 obtained from the above process, using a conducting adhesive such as silver paste. Thereafter, the element mounting portion 10, the lead support portion 50 and the lead frame 1000 are aligned and placed over each other, and the three are fixed together by thermo-compression bonding using an adhesive such as epoxy resin. Next, using the conventional method, a wire bonding machine is used to attach the signal wires 42, grounding wires 44a and 44b, and power supply wires 46, in a fixed arrangement.

In this wire bonding process, by carrying out the wire bonding in for example the sequence of grounding wire bonding, power supply wire bonding, and then signal wire bonding, so that positions with a shorter bonding distance are treated first, it is possible to avoid for example contact with neighboring wires, enabling reliable wire bonding.

Next, the resin sealing portion 60 is molded with for example an epoxy resin using the normal molding process. At this point, molding is carried out so that the exposed surface 14 of the element mounting portion 10 is exposed from the resin sealing portion 60.

Figure 7:
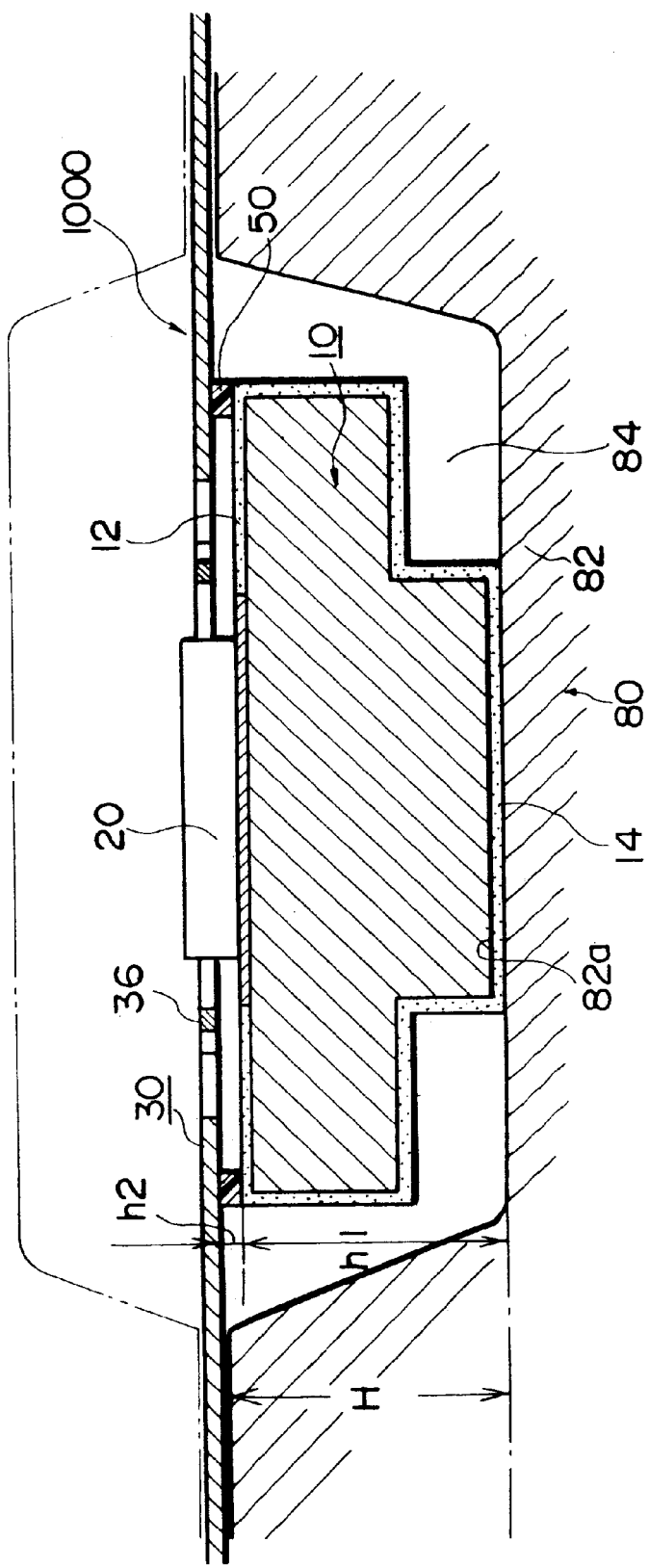
FIG. 7 is a diagram illustrating the molding in the fabrication process of the semiconductor device of the first embodiment.

FIG. 7 is a schematic diagram illustrating an example of the relationship governing a mold 80 and the element mounting portion 10 and lead support portion 50 in the molding process. As shown in FIG. 7, the sum h1+h2 of the height h1 of the element mounting portion 10 and the height (thickness) h2 of the lead support portion 50 is preferably substantially the same as the depth H of a cavity 84 of a lower mold 82. Specifically, if the thickness h2 of the lead support portion 50 is for example between about 0.05 mm and 0.5 mm, then the difference H−h1 between the depth H of the cavity 84 and the height h1 of the element mounting portion 10 is preferably between about 0 and 0.5 mm. By setting the height h1, the thickness h2 and the depth H in this way, the resin may be molded with the semiconductor element 20 and lead frame 1000 positioned accurately. Moreover, the process will ensure that the exposed surface 14 of the element mounting portion 10 is reliably exposed from the resin sealing portion 60.

Next, the substrate frame 70 and dam bar 72 shown in FIG. 6 are cut and outer leads 34 are formed as required.

The principal functions and effects of the semiconductor device 100 of this embodiment may be summed up as follows.

1) In this semiconductor device 100, heat generated by the semiconductor element 20 is dispersed efficiently through the element mounting portion 10 which has high thermal conductivity, and escapes to the outside from the exposed surface 14 exposed from the resin sealing portion 60. Since the element mounting portion 10 has an inverted T-shape in cross-section, its surface area can be increased and the heat radiation effect improved.

Moreover, as shown in FIG. 20, by providing a convex structure for the reverse side from the element mounting surface 12 on which the semiconductor element 20 is mounted, the distance from the exposed surface 14 to the element mounting surface 12 can be increased, and deterioration of the device characteristics by gas or water penetration or other matter can be kept to a minimum.

Again, since the element mounting portion 10 has an insulating layer 16 formed on the surface thereof, short-circuiting between the leads 30 and frame lead 36 and the element mounting portion 10 can be prevented. The insulating layer 16 has a dark color facilitating lead recognition in the wire bonding process, and improves the contact with the resin sealing portion 60.

2) The frame lead 36 is provided between the semiconductor element 20 and the leads 30, and using this frame lead 36 for example as a power supply lead (Vcc or Vss lead), a small number of leads 30 can be used to supply a predetermined voltage in a stable manner to power supply electrode pads 22 provided at any locations on the semiconductor element 20, reducing power supply noise, and allowing operation speeds to be increased.

The frame lead 36 allows power supply leads to be made common and reducing the number of leads required as power supply leads thus making more leads available to be used for example as signal leads, and thus wiring arrangement design flexibility is improved.

3) Since the frame lead 36 is suspended by a plurality of the second inner leads 32b in addition to being supported by the support bars 38, a sufficient support strength can be secured. Even if the frame lead 36 is downwardly deflected under its own weight, the gap between the frame lead 36 and the element mounting member 10 can be maintained at a given amount. Furthermore, each of the second inner leads 32b has a reduced electric resistance smaller than that of the bonding wires. Thus, the second inner leads 32b can supply a steady voltage to the frame lead 36 with a reduced voltage drop. In addition, the second inner leads 32b does not require any wire-bonding step since they are formed integrally with the frame lead 36. This is advantageous in the manufacturing process.

4) By providing conducting layers 18a and 18b which are electrically connected to the conductive main element mounting portion on the element mounting surface 12 of the element mounting portion 10, and respectively connecting grounding electrode pads 22 on the semiconductor element 20 or leads 30 and conducting layers 18a and 18b with grounding wires 44a and 44b, any region can be desirably grounded. As a result, since it is possible to reduce the number of grounding leads, more leads available to be used for example as signal leads, and thus again lead arrangement design flexibility is improved.

(Second Embodiment)

Figure 8:
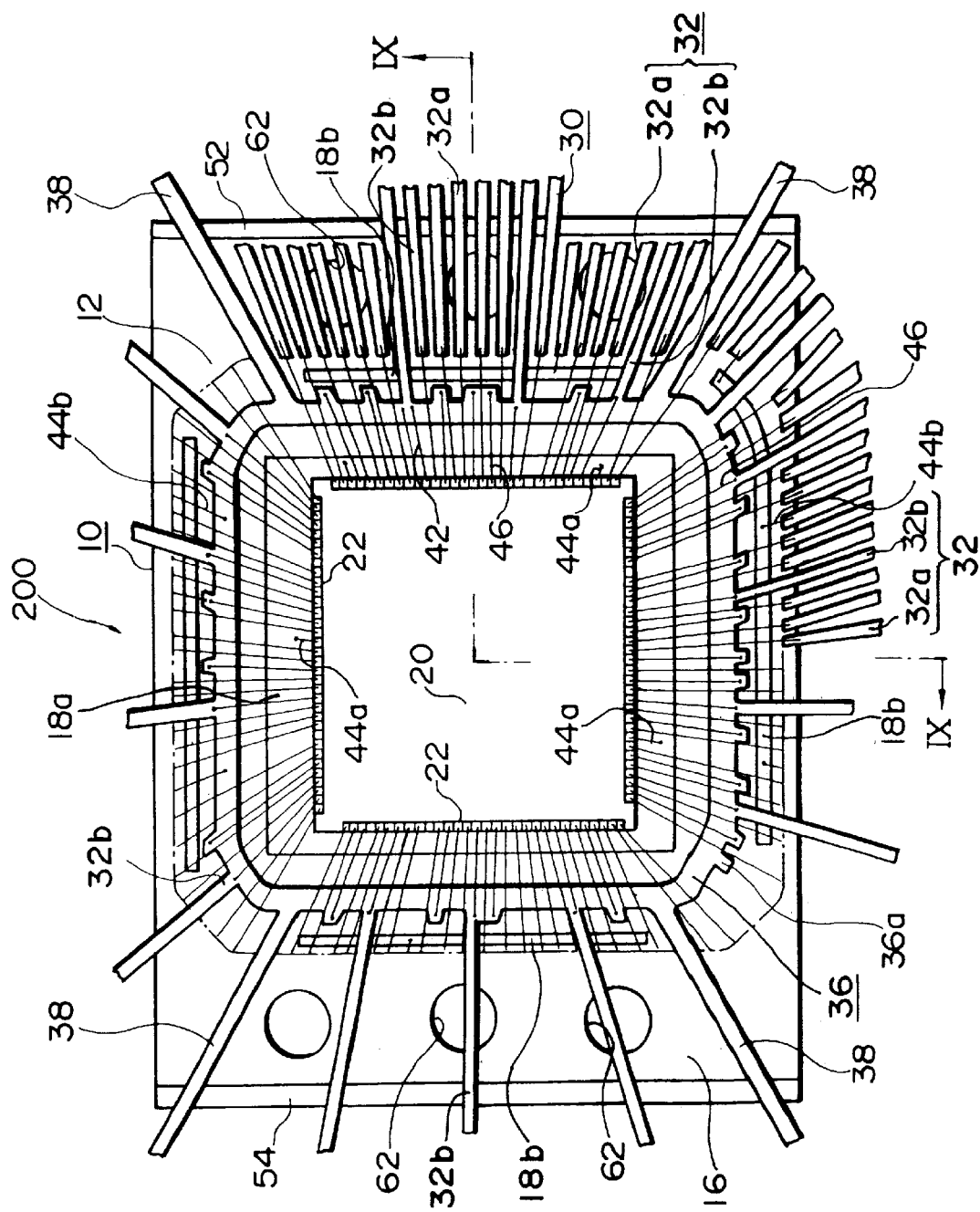
FIG. 8 is a plan view showing schematically essential portions of a semiconductor device relating to a second embodiment of the invention.
Figure 9:
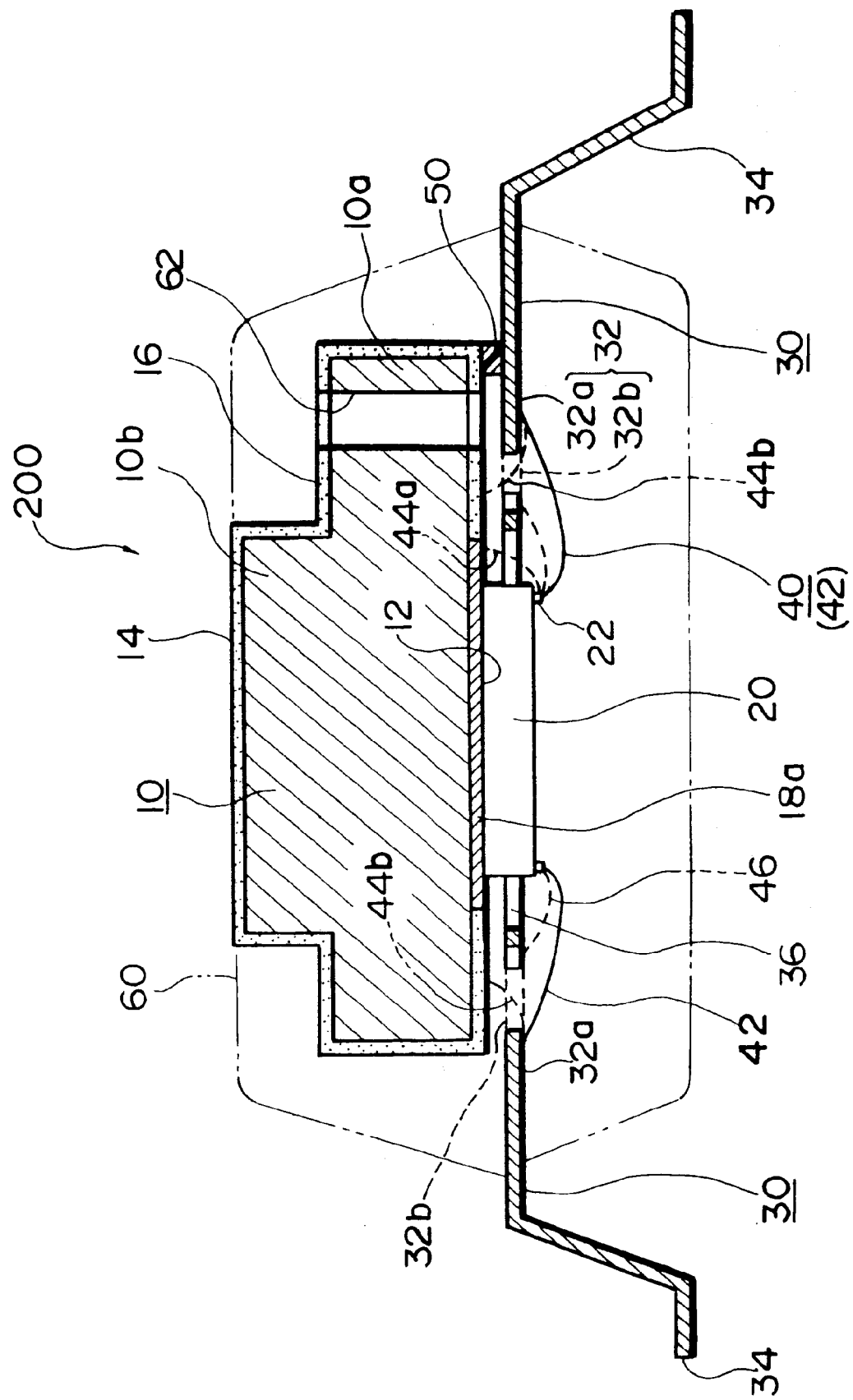
FIG. 9 is a schematically sectional view taken along the line IX—IX in FIG. 8.

A semiconductor device 200 of this embodiment is now described with reference to FIGS. 8 and 9. It should be noted that elements in these figures which have substantially the same function as corresponding elements of the semiconductor device 100 of the first embodiment are given the same reference numerals, and detailed description of them is omitted here.

The first point at which the semiconductor device 200 of this embodiment differs from the semiconductor device 100 of the first embodiment is that the top surface of the element mounting portion 10 is oblong, with longer and shorter sides, and the lead support portion comprises a pair of lead support portions 52 and 54 disposed along the shorter sides, that is to say facing each other along the longitudinal direction.

The lead support portions 52 and 54 are partially provided, because in order to secure a region to provide the semiconductor element 20 and frame lead 36, it is inevitable that the length of the inner leads 32 extending in the shorter direction is less than the length of the free end of the first inner leads 32 extending in the longer direction. In other words, if a lead support portion were provided for inner leads 32 extending in the shorter direction, it would not be possible to provide an adequate length L (see FIG. 3) for the free ends of the first inner leads 32a, and there is therefore a danger that the wire bonding process will not be able to be carried out reliably. However, as will be clear from FIG. 9, since the length of the inner leads 32 extending in the shorter direction is less than the length of the inner leads 32 extending in the longer direction, even if no structure is provided corresponding to the lead support portion due to the mechanical strength of the lead frame and leads themselves, adequate stability can be ensured during the wire bonding process.

The second point at which the semiconductor device 200 of this embodiment differs from the first embodiment is that the second conducting layer 18b forming the grounding surface for the first inner leads 32a is not in a spot-shape, but has a continuously extending strip shape along the side of the frame lead 36. With the second conducting layer 18b of this long and narrow shape, the space for forming the grounding wires 44b is enlarged, and the wiring arrangement design is made easier.

The third point at which the semiconductor device 200 of this embodiment differs from the first embodiment is that resin penetration holes 62 are formed in the large portion 10a extending in the thickness direction. The formation of these resin penetration holes 62 allows the resin forming the resin sealing portion 60 to flow into the resin penetration holes 62, and thereby the bonding strength of the element mounting portion 10 and the resin sealing portion 60 is increased) and the mechanical strength of the package is further improved.

This embodiment also provides basically the same functions as the first embodiment. Specifically, firstly by the provision of the element mounting portion 10, good heat radiation characteristics are obtained, and by the provision of the insulating layer 16 on the surface of the element mounting portion 10, short-circuiting between the leads 30 and frame lead 36 and the element mounting portion 10 can be prevented, and possibly other benefits are obtained. Secondly, by the provision of the frame lead 36, for example power supply leads can be made common, and a predetermined voltage can be supplied in a stable manner to power supply electrode pads 22 on the semiconductor element 20, and possibly other benefits are obtained. Thirdly, the frame lead 36 is integrally formed with the second inner leads 32b so that the frame lead 36 can steadily be held and a given voltage can efficiently be supplied to the frame lead 36. Fourthly, by the provision of conducting layers 18a and 18b on the element mounting portion 10, a common grounding surface can be provided, and a small number of leads can be used for a large number of grounding points, and possibly other benefits are obtained.

(Variant Form of Grounding Surface)

Figure 10A:
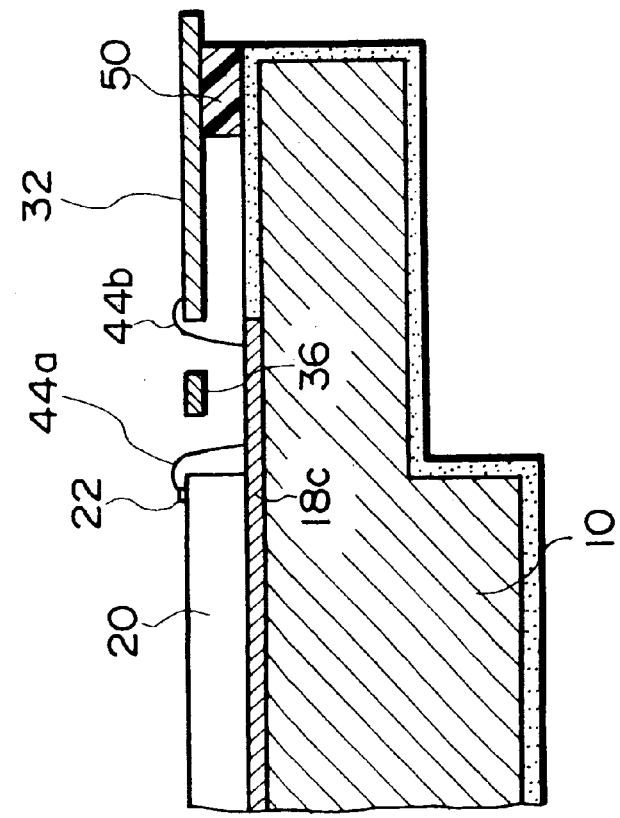
FIGS. 10A and 10B show a modified grounding plane, FIG. 10A showing a longitudinal section and FIG. 10B a plan view thereof.
Figure 10B:
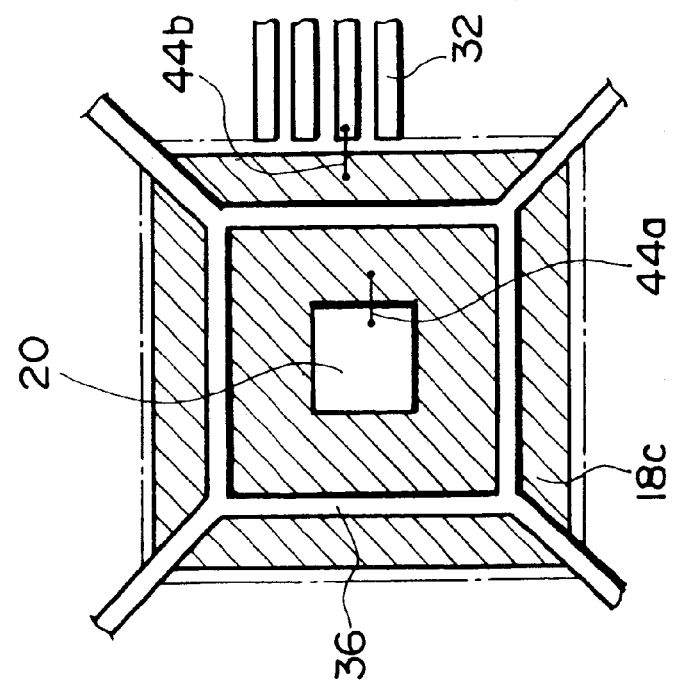

The pattern of the conducting layer on the element mounting portion 10 forming the grounding surface is not restricted to that in the embodiment above, and many variants are also possible. For example, as shown in FIGS. 10A and 10B, the grounding surface may be formed as a conducting layer 18c forming a continuous grounding surface for both the semiconductor element 20 and the inner leads 32. In this variant embodiment, since the frame lead 36 is formed over the conducting layer 18c, to prevent short-circuiting between the two it will be desirable to consider for example rigid fixing of the frame lead 36 support.

(Third Embodiment)

Figure 11:
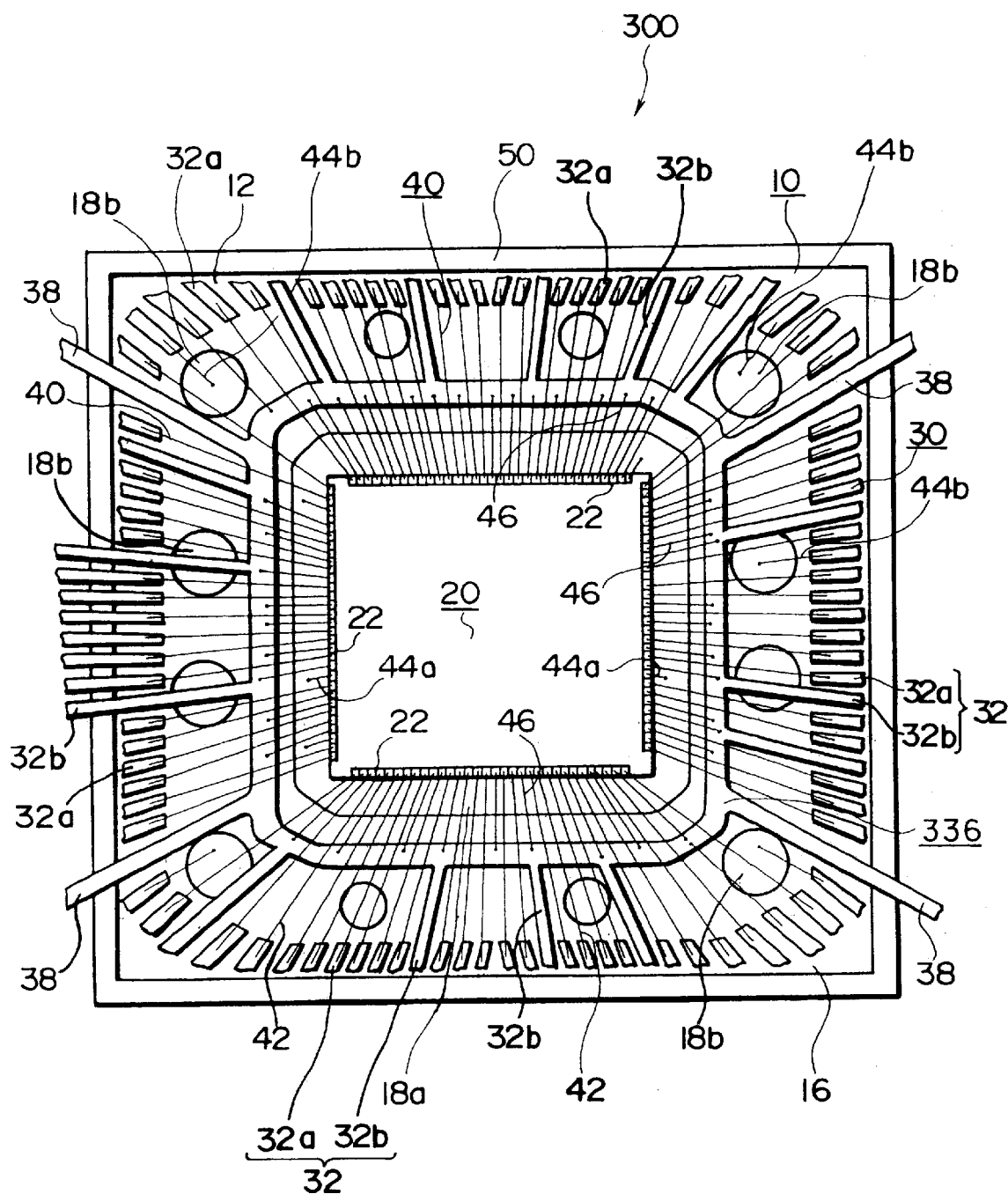
FIG. 11 is a plan view showing schematically essential portions of a semiconductor device relating to a third embodiment of the invention.

FIG. 11 is a plan view showing schematically essential portions of a semiconductor device 300 relating to a third embodiment of the invention. The semiconductor device 300 differs from the first embodiment of the semiconductor device 100 shown in FIG. 1 in the form of the frame lead. Since the structure is the same as that of the semiconductor device 100 shown in FIG. 1 except for the frame lead, the description uses the same reference numerals.

FIG. 11 shows a frame lead 336 without the identifying projections 36a of the frame lead 36 in FIG. 1. As described above, the identifying projections 36a facilitate the identification of bonding positions, but their omission in no way impinges adversely on the functioning of the frame lead itself.

Since, however, the identification of the bonding positions is made more difficult, it is preferable to employ some other means to compensate for this. For example, one possibility for providing an easily recognizable bonding position is first to connect the electrode pads 22 of the element mounting portion 10 to the first inner leads 32a, and to use the positions of these wires as a reference for identifying the bonding positions on the frame lead 336.

(Fourth Embodiment)

Figure 12:
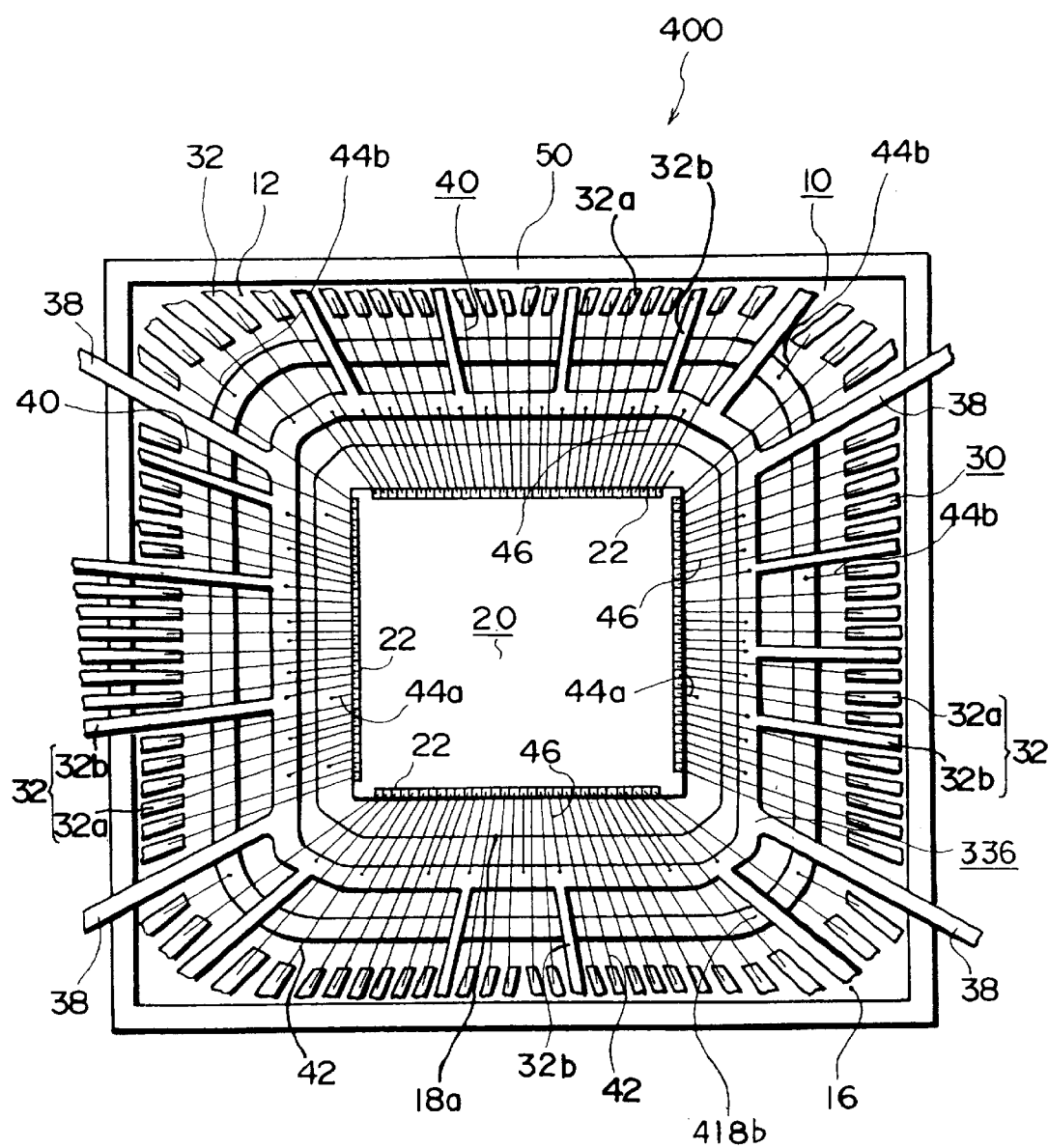
FIG. 12 is a plan view showing schematically essential portions of a semiconductor device relating to a fourth embodiment of the invention.

FIG. 12 is a plan view showing schematically essential portions of a semiconductor device 400 relating to a fourth embodiment of the invention. The semiconductor device 400 differs from the semiconductor device 300 of the third embodiment shown in FIG. 11 in the form of the second conducting layer. Since the structure is the same except for the second conducting layer as that of the semiconductor device 300 shown in FIG. 11, the description uses the same reference numerals.

In contrast with the plurality of the second conducting layer 18b in a spot-shape as shown in FIG. 11, the second conducting layer 418b in FIG. 12 is formed as a rectangular or square ring in the region between the first inner leads 32a and the frame lead 36.

In this way, a conducting layer can be formed to surround the frame lead 336 in a way more simple than by forming a plurality of the second conducting layers at separate locations.

(Fifth Embodiment)

Figure 13:
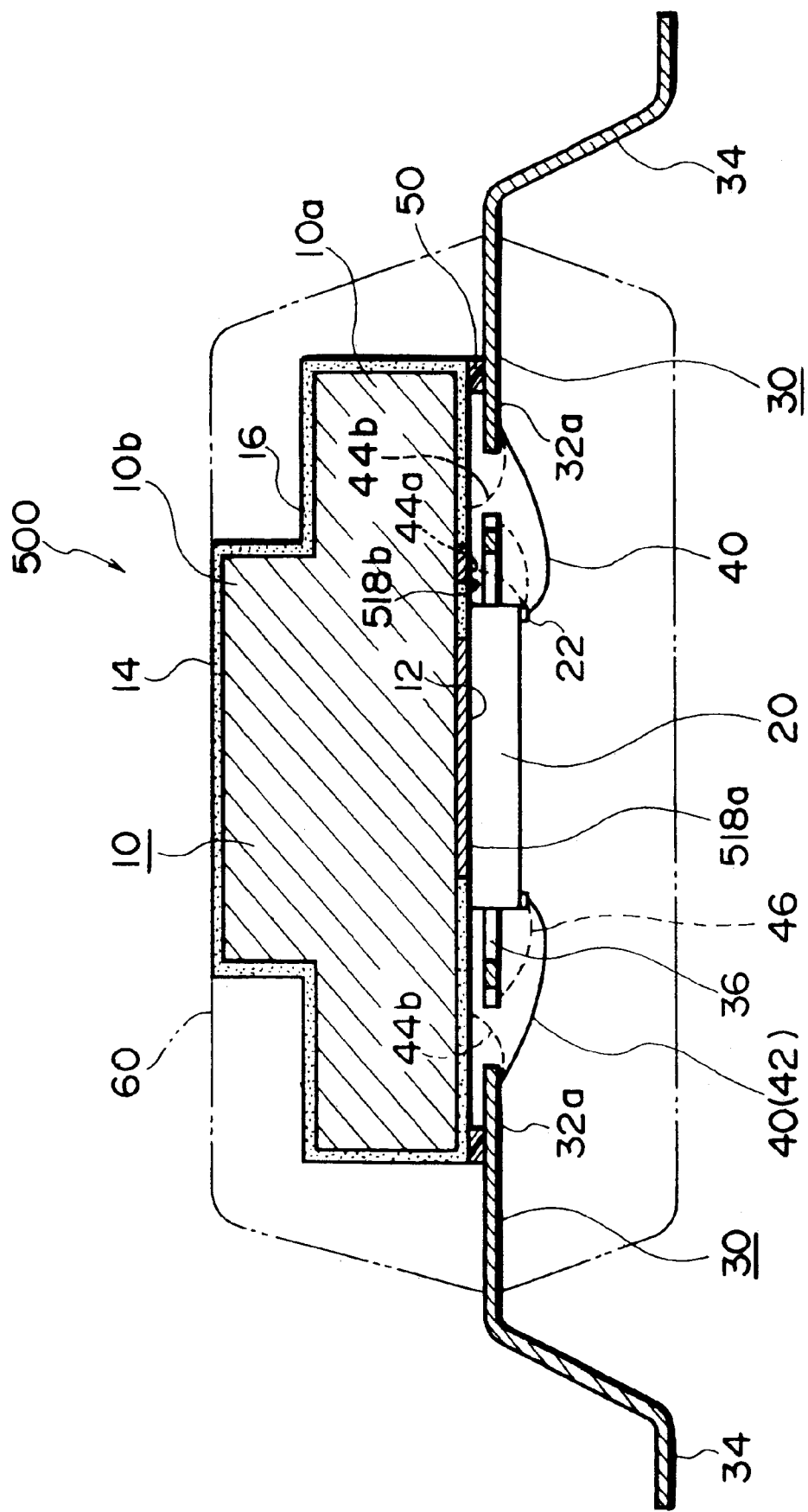
FIG. 13 is a sectional view showing schematically essential portions of a semiconductor device relating to a fifth embodiment of the invention.

FIG. 13 is a sectional view showing schematically essential portions of a semiconductor device 500 relating to a fifth embodiment of the invention. The semiconductor device 500 differs from the semiconductor device 100 shown in FIG. 2 in the form of the first conducting layer. Since the structure is the same as that of the semiconductor device 100 shown in FIG. 2 except for the first conducting layer, the description uses the same reference numerals.

FIG. 2 illustrates that the first conducting layer 18a has a greater surface area than the area occupied by the semiconductor element 20. In contrast, in FIG. 13 a first conducting layer 518a has a smaller surface area than the area occupied by the semiconductor element 20.

The reason for this is the following. As described above, the first conducting layer 18a is formed by for example silver plating, but this silver plating has poor bonding properties with the resin constituting the resin sealing portion 60. On the other hand, the insulating layer 16 is formed by oxidation, and has good bonding properties with the resin. Therefore, as shown in FIG. 2, if the first conducting layer 18a is formed to project outside the semiconductor element 20, the bonding contact of the resin sealing portion 60 with this portion is slightly poor.

In this case, as shown in FIG. 13, the first conducting layer 518a has a smaller surface area than the area occupied by the semiconductor element 20, and the first conducting layer 518a is arranged not to project outside the semiconductor element 20. By this arrangement, since the resin sealing portion 60 does not come into contact with the first conducting layer 518a, the resin seal can be complete.

If the first conducting layer 518a is formed in this way, it is not possible to connect grounding wires 44a, and it is preferable to form a conducting layer 518b (see FIG. 13) separate from the first conducting layer 518a. This conducting layer 518b is formed in a region disjoint from the reverse surface of the semiconductor element 20, so that it does not have any negative effect on the bonding properties of the semiconductor element 20 with the resin sealing portion 60.

(Sixth Embodiment)

Figure 14A:
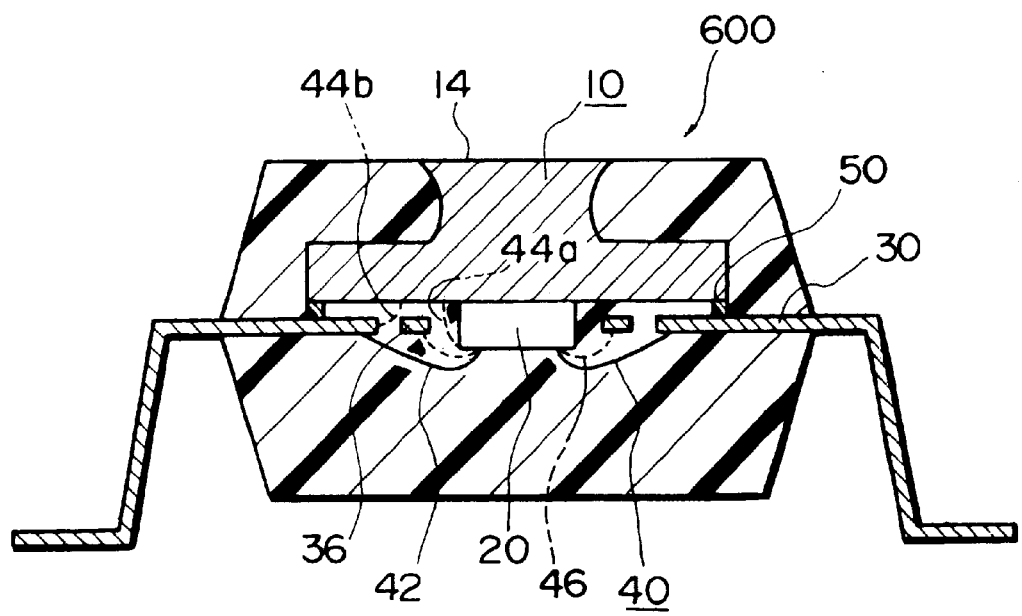
FIGS. 14A and 14B show a semiconductor device relating to a sixth embodiment of the present invention, FIG. 14A showing schematically a longitudinal section thereof and FIG. 14B an enlarged element mounting portion.
Figure 14B:
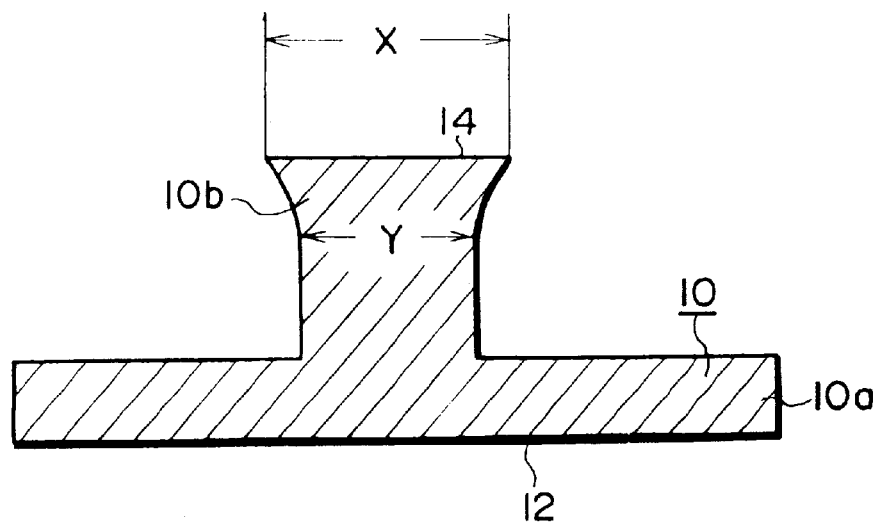

FIGS. 14A and 14B are sectional views showing schematically essential portions of a semiconductor device 600 relating to a sixth embodiment of the invention. Elements in this semiconductor device 600 which have substantially the same function as corresponding elements of the semiconductor device 100 of the first embodiment are given the same reference numerals, and detailed description of them is omitted here.

In this embodiment, the characteristic distinguished from the semiconductor device 100 is the shape of the element mounting portion 10. Specifically, the small portion 10b has an undercut form, with the width X of the exposed surface 14 greater than the width Y below and parallel to the exposed surface 14. By means of this undercut form, the small portion 10b retains the resin sealing portion 60, and further increases the mechanical strength of the package.

Furthermore, because of the undercut form, the distance from the exposed surface 14 to the large portion 10a is increased, and at least some protection against water ingress is obtained.

It should be noted that in this embodiment no conductive layer or insulating layer is formed on the surface of the element mounting portion 10.

Next, an example of fabrication method of the element mounting portion 10 of this embodiment is described with reference to FIGS. 15A to 15D.

Figure 15A:
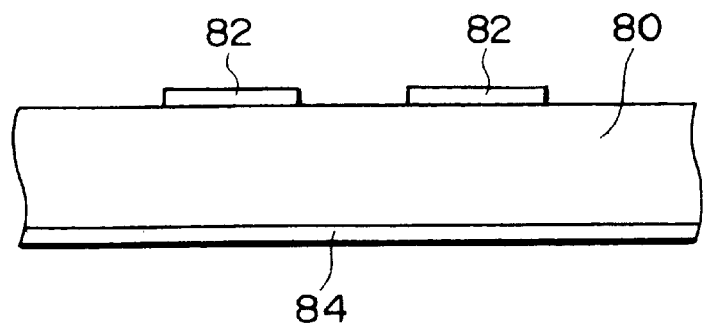
FIGS. 15A to 15D are diagrams showing fabrication processes of the element mounting portion shown in FIG. 14.

Firstly, as shown in FIG. 15A, a first resist film 82 is disposed to one surface of a metal sheet 80 of for example copper having the same thickness as the element mounting portion 10 to be formed. The first resist film 82 is disposed at predetermined intervals in portions corresponding to the exposed surface 14 of the element mounting portion 10. A second resist film 84 is formed on the underside of the metal sheet 80.

Figure 15B:
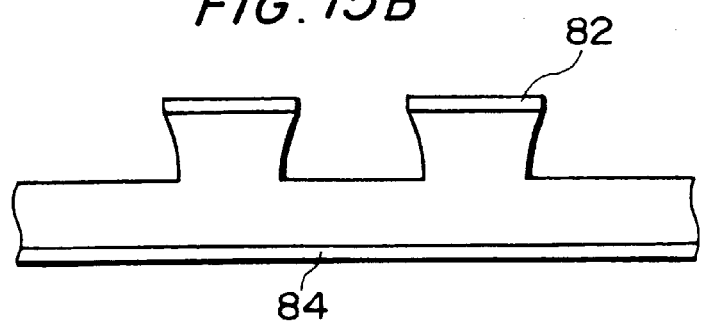

As shown in FIG. 15B, using the resist films 82 and 84 used as a mask, the metal sheet 80 is immersion etched by an etching solution with for example ferric chloride as its principal constituent. The metal sheet 80 is etched to a depth corresponding to the thickness of the small portion 10b of the element mounting portion 10.

Figure 15C:
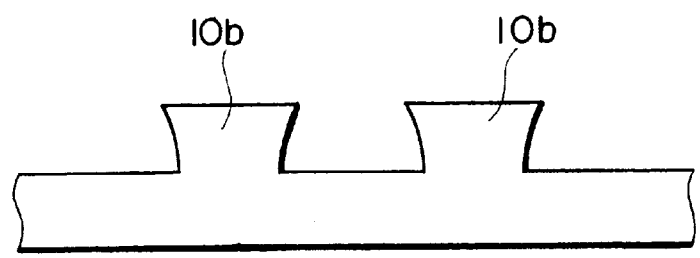
Figure 15D:
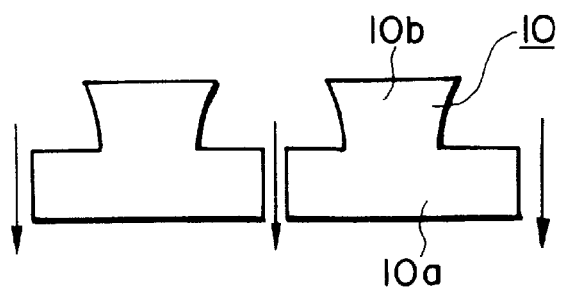

Next, as shown in FIG. 15C, the resist films 82 and 84 are removed, and then as shown in FIG. 15D, the metal sheet 80 is mechanically separated at positions delimiting the large portions 10a of the element mounting portions 10, using for example a press operation or machining operation, thus forming the element mounting portions 10.

In the above described process, since an isotropic etching process such as immersion etching is performed, the side surfaces which are subjected to the etching constitute an undercut.

Moreover, by performing immersion etching, an oxide layer forms on the etched surface, and this not only acts as an insulating layer, but also provides a surface having good bonding properties with the resin forming the resin sealing portion 60.

(Seventh Embodiment)

Figure 16:
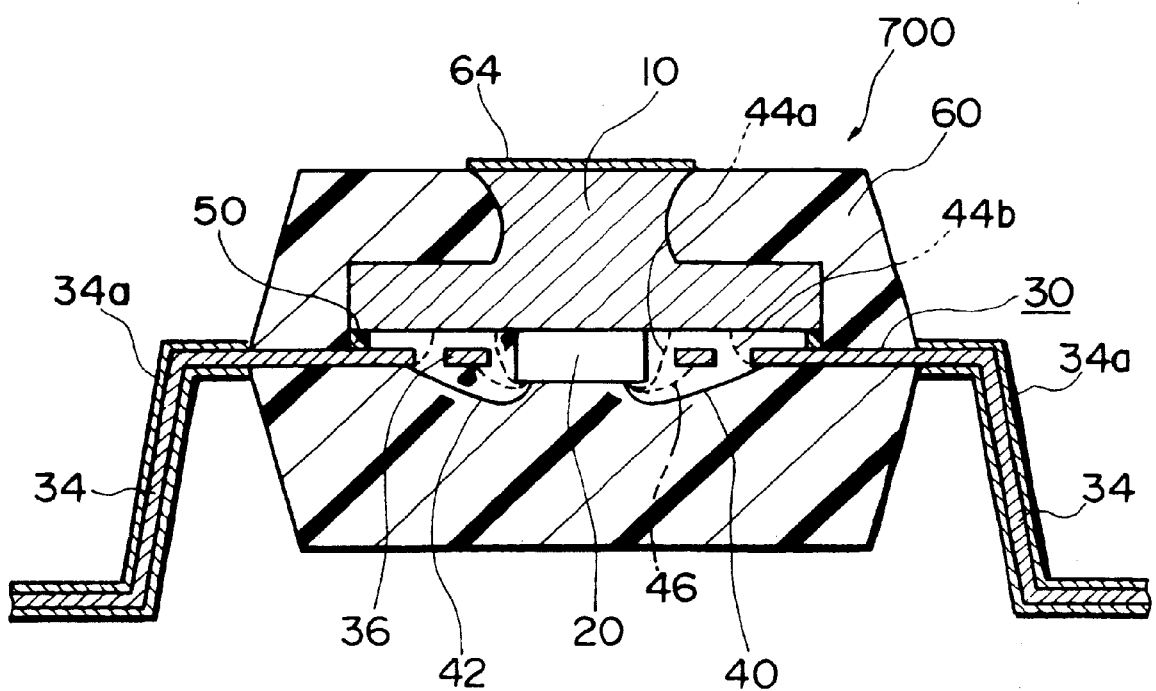
FIG. 16 is a longitudinal sectional view showing schematically a seventh embodiment of the invention.

A semiconductor device 700 relating to a seventh embodiment of the invention is described, with reference to FIG. 16. In FIG. 16, elements which have substantially the same function as corresponding elements of the sixth embodiment are given the same reference numerals, and detailed description of them is omitted here.

In this embodiment, the characteristic feature is that on the element mounting portion 10 is formed a conducting layer 64 of for example solder. This conducting layer 64 is for example formed while a solder plating layer 34a is formed on the surface of the outer leads 34 and in the same formation step as the solder plating layer 34a. By forming the conducting layer 64 in this way, the corrosion resistance effect with respect to the exposed surface 14 of the element mounting portion 10 can be improved. Further, the provision of the conducting layer 64 simplifies both the wiring connection when applying a fixed voltage including ground potential to the element mounting portion 10, and also the fitting of a cooling fin not shown in the drawings.

To describe the fitting of a cooling fin in more detail, if a cooling fin is attached by adhesive, this is likely to be detached by the heat effects. If a cooling fin is attached by a clip mechanism, the contact area between the element mounting portion 10 and the cooling fin is small. As a result, forming the conducting layer 64 of solder and attaching the cooling fin is an effective method.

More specifically, solder is first also applied to the cooling fin, then the conducting layer 64 is heated to about 180 tC and the cooling fin is heated to about 300 tC. When the two are brought into contact, the solder melts at about 180 tC and the conducting layer 64 and the cooling fin are attached completely. Since only the cooling fin is heated to a high temperature and the semiconductor device 700 is kept at a relatively low temperature, the semiconductor element 20 can be protected from heat.

(Eighth Embodiment)

Figure 17:
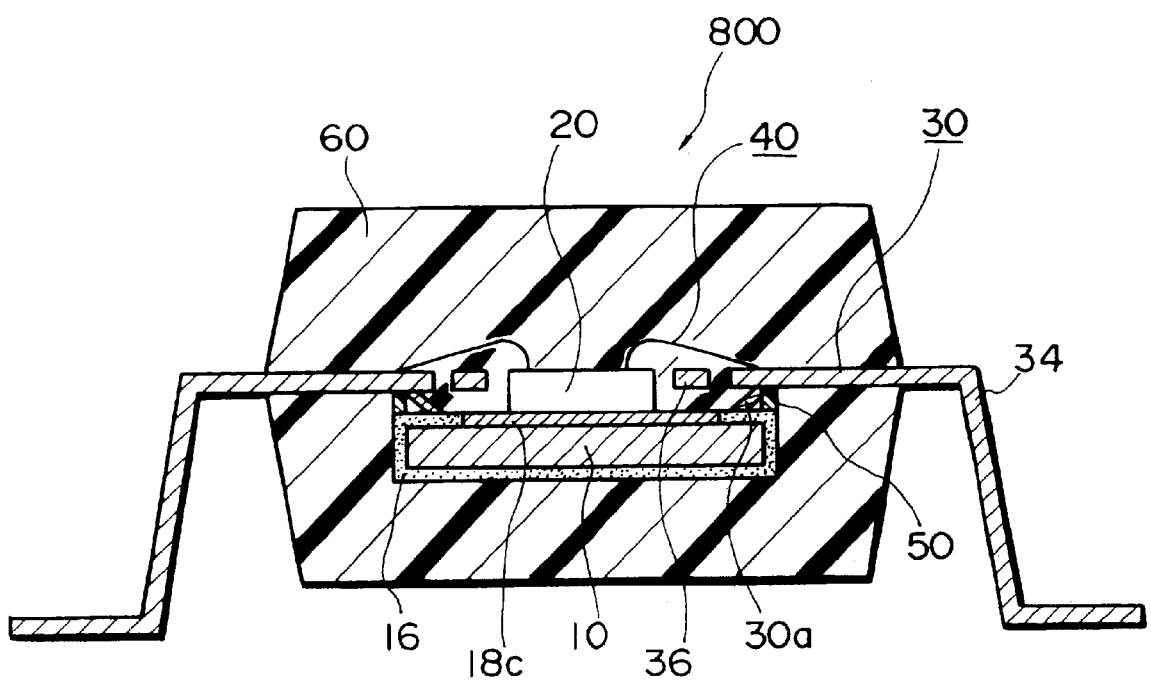
FIG. 17 is a longitudinal sectional view showing schematically an eighth embodiment of the invention.

A semiconductor device 800 relating to an eighth embodiment of the invention is now described, with reference to FIG. 17.

In FIG. 17, elements which are substantially the same as corresponding elements of the first embodiment are given the same reference numerals, and detailed description of them is omitted here. Additionally, description of grounding wires is omitted in FIG. 17.

In this embodiment, the characteristic feature is that the element mounting portion 10 is not exposed from the resin sealing portion 60, but is rather sealed within the resin sealing portion 60. In the type of semiconductor device 800 in which the element mounting portion 10 is sealed in this way, the heat radiation efficiency is inferior to that of the exposed type. Nevertheless, the semiconductor element and surrounding wiring is substantially totally sealed within the resin sealing portion 60, so that ingress of matter which might affect the semiconductor element or wiring can be more effectively prevented.

Further, in this embodiment, the leads 30 are provided with support arms 30a formed integrally therewith, so that support of the leads 30 is assured, and deformation thereof is prevented. Since the support arms 30a are electrically conductive, it is necessary for at least an insulating layer 16 to be formed in the region of the element mounting portion 10 contacted by the ends of the support arms 30a.

In a semiconductor device 800 of this type which seals the element mounting portion 10, it is preferable that the support arms 30a are provided, but if for example the lead frame strength is increased, it may be possible to dispense with the support arms 30a.

(Wire Bonding)

Figure 18:
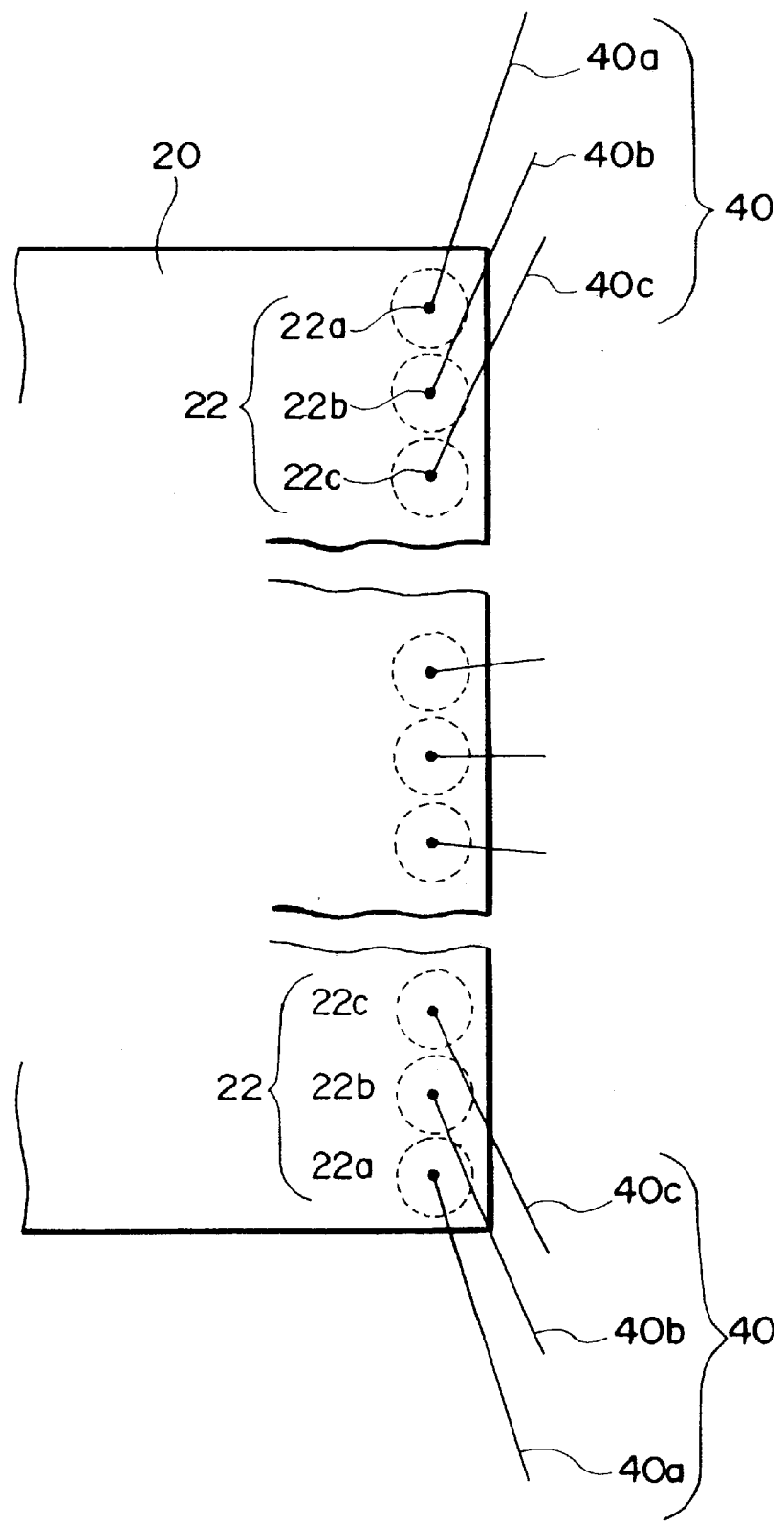
FIG. 18 is a diagram illustrating the sequence of wire bonding of electrode pads of a semiconductor element.

Next, FIG. 18 illustrates the sequence for carrying out wire bonding of wires 40 on the electrode pads 22 of a semiconductor element 20.

As shown in FIG. 1 for example, a plurality of electrode pads 22 are provided around the periphery of the surface of the semiconductor element 20, and wires 40 connecting to these electrode pads 22 are radially disposed from the center of the semiconductor element 20.

In other words, along one side of the square semiconductor element 20, whereas the wires 40 connecting to the electrode pads 22 near the center of the side are disposed substantially at right angles to the side, the wires 40 connecting to the electrode pads 22 near the corners are inclined at an oblique angle to the side. Moreover, the closer to the corner, the more oblique this inclination.

To say the same thing in reverse, the wires 40 near the corners are inclined at a large oblique angle to the side, and moving parallel to the orientation of the electrode pads toward the center, the oblique angle becomes smaller and close to the center the wires are disposed substantially perpendicular to this orientation.

This is shown magnified in FIG. 18.

The wire bonding proposed here is sequentially carried out starting near a corner and progressing toward the center. In other words, the wire bonding progresses from wires disposed at a large inclination to the orientation of the electrode pads 22 (the wires 40 near the corner) to wires 40 disposed at an angle close to perpendicular to the orientation of the electrode pads 22 (the wires 40 near the center), and in the direction in which the inclination becomes progressively more perpendicular. Specifically, in FIG. 18 wires 40a, 40b, 40c and etc. are connected in sequence to the electrode pads 22a, 22b, 22c, and etc.

The reason for this is that if wire bonding is carried out in the reverse direction, the jig clamping the wires 40 may collide with one of the already connected wires 40, severing it.

For example, consider the case in which the electrode pads 22 are connected in the sequence 22c, 22b and 22a from the center to the corner, by the wires 40c, 40b, and 40a. In this case, firstly when after connecting the wire 40c, the wire 40b is connected, the jig clamping the wire (shown as a broken circle in the figure) will contact the wire 40c. Similarly, when after connecting the wire 40b, the wire 40a is connected, the jig clamping the wire will contact the wire 40b.

Thus in this way, if the wire bonding is carried out in the direction from the center to the corner of a side of the semiconductor element 20, the jig contacts existing wires.

On the other hand, if the wire bonding is carried out in the direction from the corner to the center of a side of the semiconductor element 20, this problem does not arise. In other words, when after connecting the wire 40a, the wire 40b is connected, the jig clamping this wire 40b (shown as a broken circle in the figure) does not contact the existing wire 40a. Similarly, when after connecting the wire 40b, the wire 40c is connected, the jig clamping the wire does not contact the wire 40b. Thus, satisfactory wire bonding can be carried out.

(Resin Sealing Process)

Figure 19A:
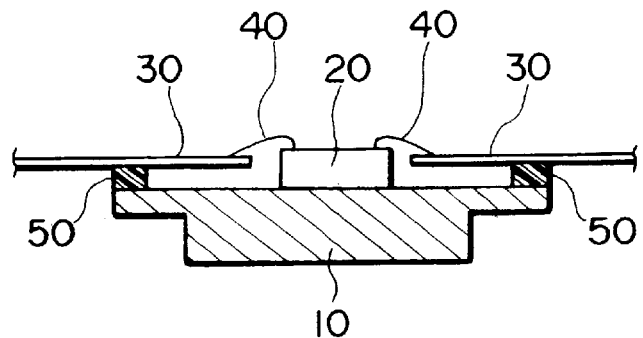
FIGS. 19A to 19D are diagrams illustrating a preferred embodiment relating to resin sealing.
Figure 19B:
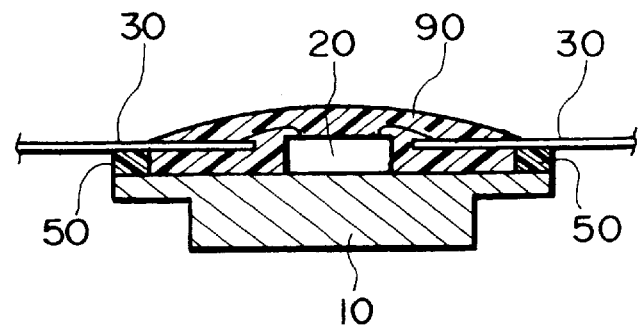

Next, FIGS. 19A to 19D illustrate a preferred embodiment relating to resin sealing.

a) First, as shown in FIG. 19A, the element mounting portion 10, semiconductor element 20, lead support portion 50, and leads 30 are bonded in the required arrangement, and then the semiconductor element 20 and the leads 30 are connected by the wires 40.

b) As shown in FIG. 19B, resin in either the molten or dissolved state is applied by potting to only a region covering the semiconductor element 20, leads 30 and wires 40, to form a resin seal 90. Potting in this way may prevent the wires 40 from being broken by the pressure of the injected resin.

Figure 19C:
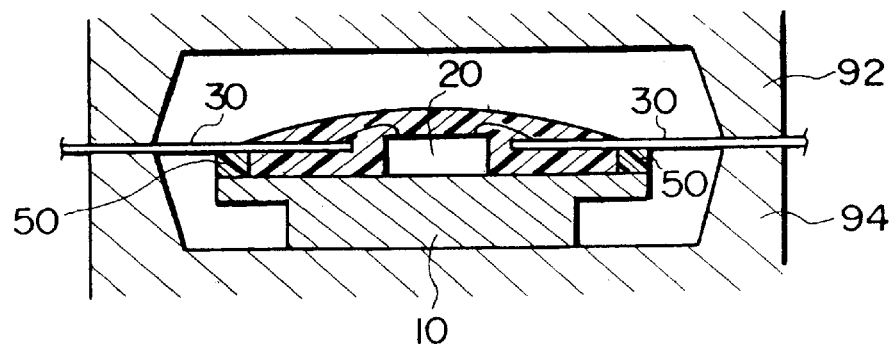

C) As shown in FIG. 19C, the element mounting portion 10 with the above elements mounted thereon is disposed with the leads 30 sandwiched between molds 92 and 94, and resin is injected. Since the wires 40 are already sealed within the resin seal 90 formed by the potting step, even if conventional resin injection is carried out, the wires 40 are protected from the pressure of the injection, and breakages can be prevented.

Figure 19D:
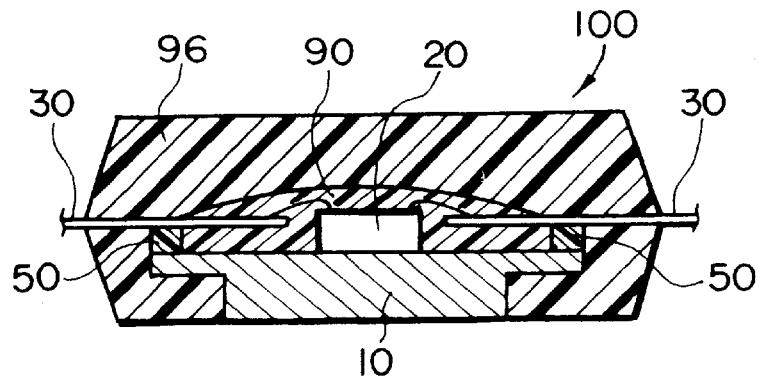

Thus, as shown in FIG. 19D, a resin sealing portion 96 is formed, and the semiconductor device 100 fabricated.

What is claimed is:

1. A resin sealing type semiconductor device, comprising:
   an element mounting member having an element mounting surface for mounting a semiconductor element;
   a semiconductor element bonded to said element mounting surface of said element mounting member;
   a frame lead disposed around a periphery of said semiconductor element and separated from said semiconductor element and said element mounting surface, said frame lead being continuous around said periphery of said semiconductor element;
   a plurality of leads disposed on and insulated from said element mounting member by an insulating lead support, said leads being separated from said semiconductor element;
   a plurality of wires including wires electrically connecting said leads with the electrodes of said semiconductor element and wires electrically connecting said frame lead with the electrodes of said semiconductor element; and
   a plurality of support bars supporting said frame lead at the corners of said frame lead;
   a resin sealing portion for sealing said element mounting member, said semiconductor element, parts of said leads and said frame lead, and
   wherein said plurality of leads comprises:
   first leads disposed discontinuously with said frame lead; and
   second leads disposed integrally with said frame and between adjacent support bars;
   said frame lead is supported by said support bars and said second leads, so as to be in non-contact with said element mounting member and said semiconductor element.

2. The resin sealing type semiconductor device as defined in claim 1, wherein said frame lead and second leads are used as power supply leads.

3. The resin sealing type semiconductor device as defined in claim 1, wherein said first leads comprise an inner lead, an end of said inner lead overlapping said element mounting surface of said element mounting member.

4. The resin sealing type semiconductor device as defined in claim 3, wherein said insulating lead support is bonded to said element mounting member and said leads so that a portion of said insulating lead support is in-between said element mounting member and said leads, said insulating lead support allowing free ends of said inner lead of each of said first leads to contact said element mounting surface of said element mounting member within the limit of resilient deformation.

5. The resin sealing type semiconductor device as defined in claim 4, wherein said insulating lead support is continuously formed around an entire periphery of said element mounting surface.

6. The resin sealing type semiconductor device as defined in claim 4, wherein said insulating lead support is formed partially around the periphery of said element mounting surface.

7. The resin sealing type semiconductor device as defined in claim 1, wherein said element mounting member comprises a substance having high thermal conductivity.

8. The resin sealing type semiconductor device as defined in claim 1, wherein said element mounting member comprises a conductive material.

9. The resin sealing type semiconductor device as defined in claim 8, wherein said element mounting member comprises at least one of copper, aluminum, silver, gold and an alloy having these metals as principal component.

10. The resin sealing type semiconductor device as defined in claim 1, wherein at least one of a first conducting layer and a second conducting layer is formed on said element mounting surface, said first conducting layer providing a ground for the electrodes of said semiconductor element and said second conducting layer providing a ground for said first leads.

11. The resin sealing type semiconductor device as defined in claim 10, wherein said first and second conducting layers comprise at least one of silver, gold, palladium and aluminum.

12. The resin sealing type semiconductor device as defined in claim 10, wherein said first and second conducting layers are formed in a mutually separated manner.

13. The resin sealing type semiconductor device as defined in claim 10, wherein said first and second conducting layers are formed in a continuous manner.

14. The resin sealing type semiconductor device as defined in claim 10, wherein an insulating layer is formed on the surface of said element mounting member, said insulating layer and said first and second conductive layers being mutually exclusive on the surface of said element mounting member.

15. The resin sealing type semiconductor device as defined in claim 14, wherein said insulating layer comprises a metal oxide film obtained by oxidizing the metal constituting said element mounting member.

16. The resin sealing type semiconductor device as defined in claim 1, wherein said element mounting member comprises a large portion and a small portion projecting from said large portion, a surface of said large portion being said element mounting surface, a cross-section of said large and small portions having an inverted T-shape.

17. The resin sealing type semiconductor device as defined in claim 16, wherein said resin seals said element mounting member except for a top surface of said small portion of said element mounting member.

18. The resin sealing type semiconductor device as defined in claim 16, wherein said small portion has an undercut extending in the thickness direction.

19. The resin sealing type semiconductor device as defined in claim 16, wherein said large portion of said element mounting member has a resin penetration hole, said resin penetration hole being formed in said large portion extending in the thickness direction except said small portion.

20. The resin sealing type semiconductor device as defined in claim 17, wherein a solder layer is formed on said top surface of said small portion of said element mounting member.

21. The resin sealing type semiconductor device as defined in claim 1, wherein said frame lead has identify in g projections or notches which provide a marking for wire bonding image recognition.

22. The resin sealing type semiconductor device as defined in claim 1, wherein said frame lead has substantially rectangular or square ring-shaped planar configuration, said frame lead being supported by support bars at four corners.

23. The resin sealing type semiconductor device as defined in claim 1, wherein the external diameter of the frame lead is in the range of 15% to 80% relative to the external diameter of the resin sealing portion.

24. A method of making a resin sealing type semiconductor device, comprising the steps of:

(a) bonding a semiconductor element to a fixed position of on an element mounting surface of an element mounting member using an adhesive;

(b) disposing an insulating lead support portion on said element mounting surface of said element mounting member, disposing a lead frame comprising integrally at least a frame lead, first leads discontinuous with said frame lead, second leads and support bars continuous with said frame lead, and bonding with adhesive said element mounting member and said lead frame with said lead support portion interposed therebetween;

said second lead interposed between adjacent support bars;

said frame lead is supported by said support bars and second leads so as to be in non-contact with said element mounting member and said semiconductor element;

(c) forming wires including wires electrically connecting said first leads and electrodes of the semiconductor element, and wires electrically connecting said frame lead and the electrodes of said semiconductor element, using a wire bonding means; and (d) disposing the components formed in said steps (a) to (c) in a metal mold, and forming a resin sealing portion by a molding process.

25. The method as defined in claim 24, wherein an adhesive used in said step (a) is electrically conductive.

26. The method as defined in claim 24, wherein at said step (c), wires connecting said first leads and the electrodes of said semiconductor element are formed by depressing said first leads with lead pressers so that ends of said first leads are in contact with said element mounting surface of said element mounting member.

* * * * *